(12) United States Patent
Tamada

(10) Patent No.: US 12,471,496 B2
(45) Date of Patent: Nov. 11, 2025

(54) PIEZOELECTRIC FILM COMPRISING A POLYMER-BASED PIEZOELECTRIC COMPOSITE MATERIAL PROVIDING SATISFACTORY ACOUSTIC CHARACTERISTIC AND DURABILITY

(71) Applicant: FUJIFILM Corporation, Tokyo (JP)

(72) Inventor: Yoshinori Tamada, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 712 days.

(21) Appl. No.: 17/882,174

(22) Filed: Aug. 5, 2022

(65) Prior Publication Data

US 2022/0384706 A1 Dec. 1, 2022

Related U.S. Application Data

(63) Continuation of application No. PCT/JP2021/000659, filed on Jan. 12, 2021.

(30) Foreign Application Priority Data

Feb. 7, 2020 (JP) ................................. 2020-019505

(51) Int. Cl.
*H10N 30/87* (2023.01)
*H10N 30/857* (2023.01)

(52) U.S. Cl.
CPC ......... *H10N 30/874* (2023.02); *H10N 30/857* (2023.02)

(58) Field of Classification Search
None
See application file for complete search history.

(56) References Cited

U.S. PATENT DOCUMENTS 9,761,784 B2 * 9/2017 Miyoshi ................. G10H 3/146
10,147,868 B2 * 12/2018 Ozawa ................ H10N 30/092
(Continued)

FOREIGN PATENT DOCUMENTS

JP 2014-209724 A 11/2014
JP 2014-212307 A 11/2014
(Continued)

OTHER PUBLICATIONS

International Preliminary Report on Patentability and Written Opinion of the International Searching Authority (Forms PCT/IB/326, PCT/IB/373, and PCT/ISA/237) for International Application No. PCT/JP2021/000659, dated Aug. 18, 2022, with an English translation.
(Continued)

*Primary Examiner* — Emily P Pham
(74) *Attorney, Agent, or Firm* — Birch, Stewart, Kolasch & Birch, LLP

(57) ABSTRACT

An object of the present invention is to provide a piezoelectric film capable of realizing an electroacoustic conversion film or the like in which the durability is high and a sufficient sound pressure with respect to an input operating voltage is obtained. The object is achieved by providing a piezoelectric film including a polymer-based piezoelectric composite material which contains piezoelectric particles in a matrix containing a polymer material, and electrode layers which are provided on both surfaces of the polymer-based piezoelectric composite material, in which in a case where a cross section of the film in a thickness direction is observed with a scanning electron microscope, the polymer-based piezoelectric composite material is divided into ten equal regions in the thickness direction, area ratios of the piezoelectric particles in two most distant regions are measured, and the area ratio of the piezoelectric particles in the region with a
(Continued)

lower area ratio is set as 1, the area ratio of the piezoelectric particles in the region with a higher area ratio is 1.2 or greater.

20 Claims, 3 Drawing Sheets

(56) References Cited

U.S. PATENT DOCUMENTS

| | | | |
|---|---|---|---|
| 10,538,461 B2* | 1/2020 | Deville | C04B 35/111 |
| 2012/0274178 A1* | 11/2012 | Ochi | H10N 30/06 |
| | | | 29/25.35 |
| 2016/0008852 A1 | 1/2016 | Miyoshi | |
| 2016/0014526 A1 | 1/2016 | Miyoshi et al. | |
| 2016/0014527 A1 | 1/2016 | Miyoshi et al. | |
| 2017/0018700 A1 | 1/2017 | Miyoshi et al. | |
| 2017/0321023 A1 | 11/2017 | Ali et al. | |
| 2017/0331030 A1 | 11/2017 | Inoue et al. | |

FOREIGN PATENT DOCUMENTS

| | | |
|---|---|---|
| JP | 2015-109627 A | 6/2015 |
| JP | 2015-192120 A | 11/2015 |
| JP | 2018-56287 A | 4/2018 |
| WO | WO2016/121765 A1 | 8/2016 |

OTHER PUBLICATIONS

International Search Report (Form PCT/ISA/210) for International Application No. PCT/JP2021/000659, dated Mar. 30, 2021, with an English translation.
Extended European Search Report for corresponding European Application No. 21751010.6, dated Jul. 6, 2023.
Liu et al., "Enhanced performance of piezoelectric composite nanogenerator based on gradient porous PZT ceramic structure for energy harvesting," Journal of Materials Chemistry A, vol. 8, 2020, pp. 19631-19640.
Japanese Notice of Reasons for Refusal for corresponding Japanese Application No. 2021-575676, dated May 16, 2023, with an English translation.
European Communication pursuant to Article 94(3) EPC for corresponding European Application No. 21 751 010.6, dated Jun. 28, 2024.

* cited by examiner

PIEZOELECTRIC FILM COMPRISING A POLYMER-BASED PIEZOELECTRIC COMPOSITE MATERIAL PROVIDING SATISFACTORY ACOUSTIC CHARACTERISTIC AND DURABILITY

CROSS-REFERENCE TO RELATED APPLICATIONS

This application is a Continuation of PCT International Application No. PCT/JP2021/000659 filed on Jan. 12, 2021, which claims priority under 35 U.S.C. § 119(a) to Japanese Patent Application No. 2020-019505 filed on Feb. 7, 2020. Each of the above applications is hereby expressly incorporated by reference, in its entirety, into the present application.

BACKGROUND OF THE INVENTION

1. Field of the Invention

The present invention relates to a piezoelectric film used for an electroacoustic conversion film or the like.

2. Description of the Related Art

With reduction in thickness and weight of displays such as liquid crystal displays or organic electroluminescence (EL) displays, speakers used in these thin displays are also required to be thinner and lighter. Further, with the development of flexible displays formed of flexible substrates such as plastics, speakers used in the flexible displays are also required to be flexible.

Examples of typical shapes of speakers of the related art include a funnel-like so-called cone shape and a spherical dome shape. However, in a case where such a speaker is intended to be incorporated in the above-described thin display, there is a concern that the lightness and the flexibility of the speaker are impaired because the speaker cannot be sufficiently made thin. Further, in a case where the speaker is attached externally, it is troublesome to carry the speaker.

Therefore, as a speaker that is thin and can be integrated into a thin display or a flexible display without impairing lightness and flexibility, a sheet-like piezoelectric film having flexibility and a property of stretching and contracting in response to an applied voltage has been suggested.

For example, a piezoelectric film (electroacoustic conversion film) disclosed in JP2014-212307A has been suggested as a sheet-like piezoelectric film that has flexibility and can stably reproduce a high-quality sound.

For example, the piezoelectric film disclosed in JP2014-212307A includes a polymer-based piezoelectric composite material obtained by dispersing piezoelectric particles in a viscoelastic matrix consisting of a polymer material having a viscoelasticity at room temperature, and electrode layers provided to sandwich the polymer-based piezoelectric composite material. The piezoelectric film described in JP2014-212307A includes a protective layer formed on the surface of a thin film electrode as a preferred aspect.

SUMMARY OF THE INVENTION

Such a piezoelectric film functions as a piezoelectric speaker by, for example, being maintained in a bent state. That is, by maintaining the piezoelectric film in a bent state and applying a driving voltage to the electrode layer, the polymer-based piezoelectric composite material stretches and contracts due to the stretch and contraction of the piezoelectric particles and the piezoelectric film vibrates to absorb the stretch and contraction in a direction orthogonal to the surface. The piezoelectric film vibrates the air through this vibration and converts an electric signal into a sound.

The expression of "the piezoelectric film vibrates in a direction orthogonal to the surface" indicates that a state where the polymer-based piezoelectric composite material constituting the piezoelectric film is greatly warped in a direction orthogonal to the surface and a state where the polymer-based piezoelectric composite material is returned to the original state are repeated.

In the state where the polymer-based piezoelectric composite material is warped in a direction orthogonal to the surface, the polymer-based piezoelectric composite material has a region where the degree of a volume change varies in the thickness direction. That is, in the state where the polymer-based piezoelectric composite material is warped, the volume thereof on a projection side is large and the volume thereof on a recess side is small.

Due to such a difference in volume change in the thickness direction, a large stress such as deformation or distortion is imparted to the polymer-based piezoelectric composite material, and defects such as cracking and peeling of the piezoelectric film from the electrode layer occur. Therefore, as the piezoelectric film is used, deterioration of acoustic characteristics such as a decrease in sound pressure occurs.

However, in the piezoelectric film of the related art, deterioration of acoustic characteristics due to defects caused by the stress imparted to the polymer-based piezoelectric composite material has not been sufficiently considered.

The present invention has been made to solve such problems of the related art, and an object thereof is to provide a piezoelectric film which has satisfactory durability to prevent occurrence of defects due to a stress imparted to a polymer-based piezoelectric composite material and has a satisfactory acoustic characteristic of obtaining a sufficient sound pressure with respect to an input operating voltage.

In order to solve the above-described problem, the present invention has the following configurations.

[1] A piezoelectric film comprising: a polymer-based piezoelectric composite material which contains piezoelectric particles in a matrix containing a polymer material; and electrode layers which are provided on both surfaces of the polymer-based piezoelectric composite material, in which in a case where a cross section of the film in a thickness direction is observed with a scanning electron microscope, the polymer-based piezoelectric composite material is divided into ten equal regions in the thickness direction, area ratios of the piezoelectric particles in two most distant regions are measured, and the area ratio of the piezoelectric particles in the region with a lower area ratio is set as 1, the area ratio of the piezoelectric particles in the region with a higher area ratio is 1.2 or greater.

[2] The piezoelectric film according to [1], in which an average area ratio of the piezoelectric particles in the two most distant regions is 23% or greater.

[3] The piezoelectric film according to [1] or [2], in which, in the two most distant regions, in a case where the area ratio of the piezoelectric particles in the region with the lower area ratio is set as 1, the area ratio of the piezoelectric particles in the region with the higher area ratio is 70 or less.

[4] The piezoelectric film according to any one of [1] to [3], in which the piezoelectric film is polarized in the thickness direction.
[5] The piezoelectric film according to any one of [1] to [4], in which the piezoelectric film has no in-plane anisotropy as a piezoelectric characteristic.
[6] The piezoelectric film according to any one of [1] to [5], further comprising: a lead-out wire which connects the electrode layer and an external power source.
[7] The piezoelectric film according to any one of [1] to [6], further comprising: a protective layer which is laminated on a surface of at least one electrode layer.
[8] The piezoelectric film according to any one of [1] to [7], in which the polymer material contains a cyanoethyl group.
[9] The piezoelectric film according to [8], in which the polymer material is cyanoethylated polyvinyl alcohol.
[10] The piezoelectric film according to any one of [1] to [9], in which the piezoelectric particles consist of ceramic particles having a perovskite-type or wurtzite-type crystal structure.

Such a piezoelectric film of the present invention has satisfactory durability to prevent occurrence of defects due to a stress imparted to the polymer-based piezoelectric composite material and has a satisfactory acoustic characteristic of obtaining a sufficient sound pressure with respect to an input operating voltage.

DESCRIPTION OF THE PREFERRED EMBODIMENTS

Figure 1:
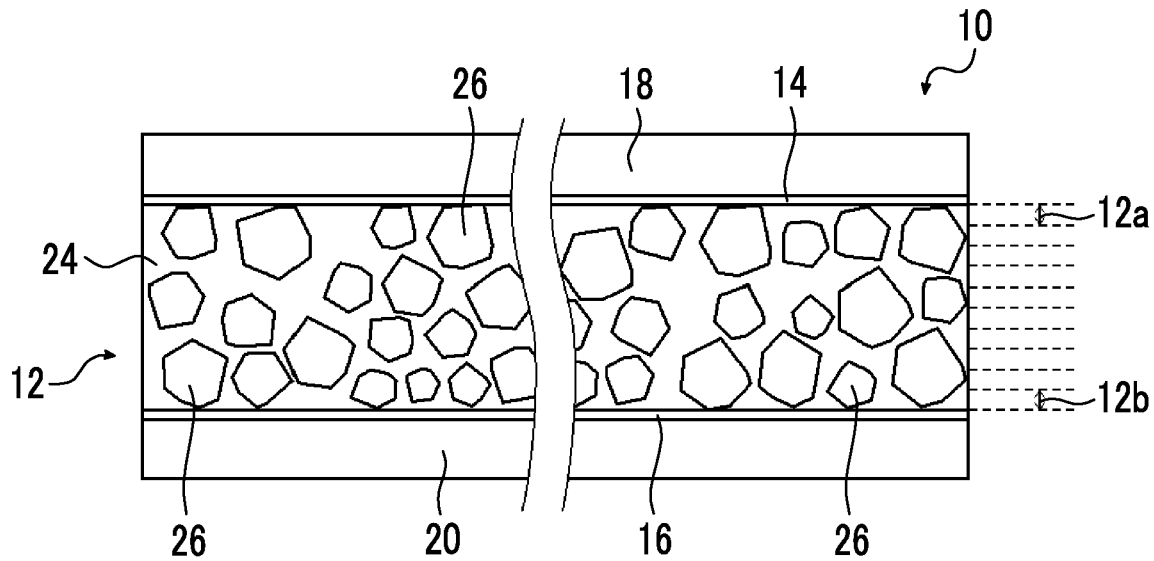
FIG. 1 is a cross-sectional view conceptually illustrating an example of the piezoelectric film according to the embodiment of the present invention.

Hereinafter, the piezoelectric film of the present invention will be described in detail based on the preferred embodiments shown in the accompanying drawings.

Descriptions of the constituent requirements described below may be made based on representative embodiments of the present invention, but the present invention is not limited to such embodiments.

In the present specification, a numerical range shown using "to" indicates a range including numerical values described before and after "to" as a lower limit and an upper limit.

In addition, the figures shown below are conceptual views for describing the present invention, and the thickness of each layer, the size of the piezoelectric particles, the size of the constituent members, and the like are different from the actual values.

A piezoelectric film according to the embodiment of the present invention includes electrode layers on both surfaces of the polymer-based piezoelectric composite material and preferably a protective layer on the surface of at least one electrode layer. The polymer-based piezoelectric composite material is a material containing piezoelectric particles in a matrix containing a polymer material. Further, it is preferable that the piezoelectric film according to the embodiment of the present invention further includes protective layers on the surfaces of both the electrode layers.

In such a piezoelectric film according to the embodiment of the present invention, in a case where a cross section of the film in a thickness direction is observed with a scanning electron microscope (SEM), the polymer-based piezoelectric composite material is divided into ten equal regions in the thickness direction, area ratios of the piezoelectric particles in two most distant regions are measured, and the area ratio of the piezoelectric particles in the region with a lower area ratio is set as 1, the area ratio of the piezoelectric particles in the region with a higher area ratio is 1.2 or greater.

In the following description, the "cross section" indicates a cross section of the piezoelectric film in the thickness direction unless otherwise specified. The thickness direction of the piezoelectric film is the lamination direction of each layer.

The piezoelectric film according to the embodiment of the present invention is used, for example, as an electroacoustic conversion film. Specifically, the piezoelectric film according to the embodiment of the present invention is used as a vibration plate of an electroacoustic converter such as a piezoelectric speaker, a microphone, or a voice sensor.

In an electroacoustic converter, in a case where the piezoelectric film is stretched in the in-plane direction due to application of a voltage to the piezoelectric film, the piezoelectric film moves upward (in the ejective direction of the sound) in order to absorb the stretched part. On the contrary, in a case where the piezoelectric film is contracted in the in-plane direction due to application of a voltage to the piezoelectric film, the piezoelectric film moves downward in order to absorb the contracted part.

The electroacoustic converter converts vibration (sound) and an electric signal using vibration caused by repeated stretch and contraction of the piezoelectric film. For example, the electroacoustic converter is used to input a voice electric signal to the piezoelectric film to reproduce a sound due to the vibration of the piezoelectric film, convert the vibration of the piezoelectric film to an electric signal by receiving a sound wave, apply tactile sensation through the vibration of the piezoelectric film, or transport an object through the vibration of the piezoelectric film.

Further, the piezoelectric film according to the embodiment of the present invention can be suitably used for various applications such as various sensors, acoustic devices, haptics, ultrasonic transducers, actuators, damping materials (dampers), and vibration power generators.

Examples of the sensors for which the piezoelectric film according to the embodiment of the present invention is used include sonic sensors, ultrasonic sensors, pressure sensors, tactile sensors, strain sensors, and vibration sensors. The sensors for which the piezoelectric film according to the embodiment of the present invention is used are particularly useful for infrastructure inspection such as crack detection and test at manufacturing sites such as foreign matter contamination detection.

Examples of the acoustic devices for which the piezoelectric film according to the embodiment of the present invention is used include microphones, pickups, speakers, and exciters. Specific applications of the acoustic devices for which the piezoelectric film according to the embodiment of the present invention is used include noise cancellers used for cars, trains, airplanes, robots, and the like, artificial voice cords, buzzers for preventing invasion of pests and harmful animals, furniture having a voice output function, wallpaper, photos, helmets, goggles, headrests, signage, and robot.

Examples of applications of the haptics for which the piezoelectric film according to the embodiment of the present invention is used include automobiles, smartphones, smart watches, and games.

Examples of the ultrasonic transducers for which the piezoelectric film according to the embodiment of the present invention is used include ultrasonic probes and hydrophones.

Examples of applications of the actuators for which the piezoelectric film according to the embodiment of the present invention is used include preventing adhesion of water droplets, transportation, stirring, dispersion, and polishing.

Examples of applications of the damping materials for which the piezoelectric film according to the embodiment of the present invention is used include sports equipment such as containers, vehicles, buildings, skis, and rackets.

Further, examples of application of the vibration power generators for which the piezoelectric film according to the embodiment of the present invention is used include roads, floors, mattresses, chairs, shoes, tires, wheels, and computer keyboards.

Further, the same applies to a laminate (laminated piezoelectric element) of piezoelectric films described below, which is obtained by laminating a plurality of layers of the piezoelectric films according to the embodiment of the present invention, in terms of the applications.

FIG. 1 is a cross-sectional view conceptually illustrating an example of the piezoelectric film according to the embodiment of the present invention.

A piezoelectric film 10 illustrated in FIG. 1 includes a piezoelectric layer 12, an upper thin film electrode 14 laminated on one surface of the piezoelectric layer 12, an upper protective layer 18 laminated on the upper thin film electrode 14, a lower thin film electrode 16 laminated on the other surface of the piezoelectric layer 12, and a lower protective layer 20 laminated on the lower thin film electrode 16. Further, the upper thin film electrode 14 and the lower thin film electrode 16 are electrode layers in the present invention.

In the piezoelectric film 10, the piezoelectric layer 12 contains piezoelectric particles 26 in a polymer matrix 24 containing a polymer material, as conceptually illustrated in FIG. 1. That is, the piezoelectric layer 12 is a polymer-based piezoelectric composite material in the piezoelectric film according to the embodiment of the present invention.

Here, it is preferable that the polymer-based piezoelectric composite material (piezoelectric layer 12) satisfies the following requirements. Further, in the present invention, room temperature is in a range of 0° C. to 50° C.

(i) Flexibility

For example, in a case of being gripped in a state of being loosely bent like a document such as a newspaper or a magazine as a portable device, the piezoelectric film is continuously subjected to large bending deformation from the outside at a relatively slow vibration of less than or equal to a few Hz. In this case, in a case where the polymer-based piezoelectric composite material is hard, a large bending stress is generated to that extent, and a crack is generated at the interface between a polymer matrix and piezoelectric particles, which may lead to breakage. Accordingly, the polymer-based piezoelectric composite material is required to have appropriate flexibility. In addition, in a case where strain energy is diffused into the outside as heat, the stress is able to be relieved. Therefore, the polymer-based piezoelectric composite material is required to have an appropriately large loss tangent.

(ii) Acoustic Quality

In a speaker, the piezoelectric particles vibrate at a frequency of an audio band of 20 Hz to 20 kHz, and the vibration energy causes the entire vibration plate (polymer-based piezoelectric composite material) to vibrate integrally so that a sound is reproduced. Therefore, in order to increase the transmission efficiency of the vibration energy, the polymer-based piezoelectric composite material is required to have appropriate hardness. In addition, in a case where the frequencies of the speaker are smooth as the frequency characteristic thereof, an amount of change in acoustic quality in a case where the lowest resonance frequency $f_0$ is changed in association with a change in the curvature of the speaker decreases. Therefore, the loss tangent of the polymer-based piezoelectric composite material is required to be appropriately large.

It is known that the lowest resonance frequency $f_0$ of the vibration plate for a speaker is represented by the following equation. Here, s represents the stiffness of the vibration system and m represents the mass.

$$\text{Lowest resonance frequency:} f_0 = \frac{1}{2\pi}\sqrt{\frac{s}{m}}$$

Here, as the degree of curvature of the piezoelectric film, that is, the radius of curvature of the curved portion increases, the mechanical stiffness s decreases, and thus the lowest resonance frequency $f_0$ decreases. That is, the acoustic quality (the volume and the frequency characteristics) of the speaker changes depending on the radius of curvature of the piezoelectric film.

That is, the polymer-based piezoelectric composite material is required to exhibit a behavior of being rigid with respect to a vibration of 20 Hz to 20 kHz and being flexible with respect to a vibration of less than or equal to a few Hz. In addition, the loss tangent of a polymer-based piezoelectric composite material is required to be appropriately large with respect to the vibration of all frequencies of 20 kHz or less.

In general, a polymer solid has a viscoelasticity relieving mechanism, and a molecular movement having a large scale is observed as a decrease (relief) in a storage elastic modulus (Young's modulus) or a maximal value (absorption) in a loss elastic modulus along with an increase in temperature or a decrease in frequency. Among these, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer-based piezoelectric composite material (piezoelectric layer 12), the polymer-based piezoelectric composite material exhibiting a behavior of being rigid with respect to a vibration of 20 Hz to 20 kHz and being flexible with respect to a vibration of less than or equal to a few Hz is realized by using a polymer material whose glass transition point is room temperature, that is, a polymer material having a viscoelasticity at room temperature as a matrix. In particular, from the viewpoint that such a behavior is suitably exhibited, it is preferable that the polymer material in which the glass transition temperature at a frequency of 1 Hz is at room temperature is used for a matrix of the polymer-based piezoelectric composite material.

In the polymer material, it is preferable that the maximal value of a loss tangent Tan δ at a frequency of 1 Hz according to a dynamic viscoelasticity test at room temperature is 0.5 or greater.

In this manner, in a case where the polymer-based piezoelectric composite material is slowly bent due to an external force, stress concentration on the interface between the polymer matrix and the piezoelectric particles at the maximum bending moment portion is relieved, and thus satisfactory flexibility can be expected.

In the polymer material, it is preferable that a storage elastic modulus (E') at a frequency of 1 Hz according to the dynamic viscoelasticity measurement is 100 MPa or greater at 0° C. and 10 MPa or less at 50° C.

In this manner, the bending moment generated in a case where the polymer-based piezoelectric composite material is slowly bent due to the external force can be reduced, and the polymer-based piezoelectric composite material can exhibit a behavior of being rigid with respect to an acoustic vibration of 20 Hz to 20 kHz.

In addition, it is more suitable that the relative dielectric constant of the polymer material is 10 or greater at 25° C. Accordingly, in a case where a voltage is applied to the polymer-based piezoelectric composite material, a higher electric field is applied to the piezoelectric particles in the polymer matrix, and thus a large deformation amount can be expected.

However, in consideration of ensuring satisfactory moisture resistance and the like, it is suitable that the relative dielectric constant of the polymer material is 10 or less at 25° C.

Suitable examples of the polymer material that satisfies such conditions include cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, and polybutyl methacrylate.

Among these, it is preferable to use a polymer material containing a cyanoethyl group and particularly preferable to use cyanoethylated PVA as the polymer material constituting the polymer matrix 24. That is, in the piezoelectric film 10 according to the embodiment of the present invention, it is preferable to use a polymer material containing a cyanoethyl group and particularly preferable to use cyanoethylated PVA as the polymer matrix 24 of the piezoelectric layer 12.

In the description below, the above-described polymer materials typified by cyanoethylated PVA will also be collectively referred to as the "polymer material having a viscoelasticity at room temperature" for convenience.

Further, the polymer material having a viscoelasticity at room temperature may be used alone or in combination (mixture) of two or more kinds thereof.

In the piezoelectric film 10 according to the embodiment of the present invention, a plurality of polymer materials may be used in combination as necessary for the polymer matrix 24 of the piezoelectric layer 12.

That is, for the purpose of adjusting dielectric characteristics, mechanical characteristics, and the like, other dielectric polymer materials may be added to the polymer matrix 24 constituting the polymer-based piezoelectric composite material in addition to the polymer material having a viscoelasticity at room temperature as necessary.

Examples of the dielectric polymer material that can be added thereto include a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, or a polyvinylidene fluoride-tetrafluoroethylene copolymer, a polymer containing a cyano group or a cyanoethyl group such as a vinylidene cyanide-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, or cyanoethyl sorbitol, and synthetic rubber such as nitrile rubber or chloroprene rubber.

Among these, a polymer material containing a cyanoethyl group is suitably used.

In addition, as these polymer materials, a commercially available product such as Hybrar 5127 (manufactured by Kuraray Co., Ltd.) can also be suitably used.

Further, in the polymer matrix 24 of the piezoelectric layer 12, the number of these dielectric polymer materials is not limited to one, and a plurality of kinds of dielectric polymer materials may be added.

In addition, for the purpose of adjusting the glass transition point of the polymer matrix 24, the polymer matrix 24 may contain a thermoplastic resin such as a vinyl chloride resin, polyethylene, polystyrene, a methacrylic resin, polybutene, or isobutylene, and a thermosetting resin such as a phenol resin, a urea resin, a melamine resin, an alkyd resin, or mica in addition to the dielectric polymer materials.

Further, for the purpose of improving the pressure sensitive adhesiveness, a viscosity imparting agent such as rosin ester, rosin, terpene, terpene phenol, or a petroleum resin may be added.

In the polymer matrix 24 of the piezoelectric layer 12, the addition amount in a case of adding polymer materials other than the polymer material having a viscoelasticity at room temperature is not particularly limited, but is preferably set to 30% by mass or less in terms of the proportion of the polymer materials in the polymer matrix 24.

In this manner, the characteristics of the polymer material to be added can be exhibited without impairing the viscoelasticity relieving mechanism in the polymer matrix 24, and thus preferable results, for example, an increase in the dielectric constant, improvement of the heat resistant, and improvement of the adhesiveness between the piezoelectric particles 26 and the electrode layer can be obtained.

The piezoelectric layer 12 (polymer-based piezoelectric composite material) contains the piezoelectric particles 26 in the polymer matrix.

It is preferable that the piezoelectric particles 26 consist of ceramic particles having a perovskite-type or wurtzite-type crystal structure.

As the ceramic particles forming the piezoelectric particles 26, for example, lead zirconate titanate (PZT), lead lanthanum zirconate titanate (PLZT), barium titanate (BaTiO$_3$), zinc oxide (ZnO), and a solid solution (BFBT) of barium titanate and bismuth ferrite (BiFe$_3$) are exemplified. Among these, PZT is suitably used.

The particle diameter of the piezoelectric particles 26 may be appropriately selected according to the size and the applications of the piezoelectric film 10. The particle diameter of the piezoelectric particles 26 is preferably in a range of 1 to 10 μm.

By setting the particle diameter of the piezoelectric particles 26 to be in the above-described range, preferable results in terms of achieving both excellent piezoelectric characteristics and flexibility can be obtained.

In the piezoelectric film 10, the ratio between the amount of the polymer matrix 24 and the amount of the piezoelectric particles 26 in the piezoelectric layer 12 may be appropriately set according to the size and the thickness of the piezoelectric film 10 in the plane direction, the applications of the piezoelectric film 10, the characteristics required for the piezoelectric film 10, and the like.

The volume fraction of the piezoelectric particles 26 in the piezoelectric layer 12 is preferably in a range of 30% to 70% and particularly preferably 50% or greater, and thus the volume fraction thereof is more preferably in a range of 50% to 70%.

By setting the ratio between the amount of the polymer matrix 24 and the amount of the piezoelectric particles 26 to be in the above-described range, preferable results in terms of achieving both of excellent piezoelectric characteristics and flexibility can be obtained.

In the piezoelectric film 10, the thickness of the piezoelectric layer 12 is not limited and may be appropriately set according to the size of the piezoelectric film 10, the applications of the piezoelectric film 10, the characteristics required for the piezoelectric film 10, and the like.

The thickness of the piezoelectric layer 12 is preferably in a range of 8 to 300 μm, more preferably in a range of 8 to 150 μm, still more preferably in a range of 15 to 100 μm, and particularly preferably in a range of 25 to 75 μm.

It is preferable that the piezoelectric layer 12 is subjected to a polarization treatment (poling) in the thickness direction. The polarization treatment will be described in detail later.

The piezoelectric film 10 illustrated in FIG. 1 has a configuration in which the upper thin film electrode 14 is provided on one surface of the piezoelectric layer 12, the upper protective layer 18 is provided on the upper thin film electrode 14 as a preferred embodiment, the lower thin film electrode 16 is provided on the other surface of the piezoelectric layer 12, and the lower protective layer 20 is provided on the lower thin film electrode 16 as a preferred embodiment. In the piezoelectric film 10, the upper thin film electrode 14 and the lower thin film electrode 16 form an electrode pair.

That is, the piezoelectric film 10 according to the embodiment of the present invention has a configuration in which both surfaces of the piezoelectric layer 12 are sandwiched between the electrode pair, that is, the upper thin film electrode 14 and the lower thin film electrode 16 and preferably between the upper protective layer 18 and the lower protective layer 20.

The region sandwiched between the upper thin film electrode 14 and the lower thin film electrode 16 is driven according to the applied voltage.

In the present invention, the terms "upper" and "lower" in the upper thin film electrode 14 and the upper protective layer 18, and the lower thin film electrode 16 and the lower protective layer 20 are provided based on the accompanying drawings for convenience in order to describe the piezoelectric film 10 according to the embodiment of the present invention.

Therefore, the terms "upper" and "lower" in the piezoelectric film 10 according to the embodiment of the present invention have no position and technical implications and are irrelevant to the actual use state.

Further, the piezoelectric film 10 according to the embodiment of the present invention may further include a bonding layer for bonding the thin film electrode and the piezoelectric layer 12 to each other and a bonding layer for bonding the thin film electrode and the protective layer to each other, in addition to the above-described layers.

The bonding agent may be an adhesive or a pressure sensitive adhesive. Further, the same material as the polymer material obtained by removing the piezoelectric particles 26 from the piezoelectric layer 12, that is, the polymer matrix 24 can also be suitably used as the bonding agent. Further, the bonding layer may be provided on both the upper thin film electrode 14 side and the lower thin film electrode 16 side or may be provided on only one of the upper thin film electrode 14 side or the lower thin film electrode 16 side.

Further, it is preferable that the piezoelectric film 10 includes, in addition to the above-described layers, an electrode lead-out portion (lead-out wire) for connecting the upper thin film electrode 14 and the lower thin film electrode 16 with and an external power source. Further, the piezoelectric film 10 may further have an insulating layer which covers a region where the piezoelectric layer 12 is exposed to prevent a short circuit or the like.

The electrode lead-out portion may be configured such that a portion where the thin film electrode and the protective layer project convexly outside the piezoelectric layer in the plane direction is provided or configured such that a part of the protective layer is removed to form a hole portion, and a conductive material such as silver paste is inserted into the hole portion so that the conductive material is conducted with the thin film electrode.

Each thin film electrode may have only one or two or more electrode lead-out portions. Particularly in a case of the configuration in which the electrode lead-out portion is obtained by removing a part of the protective layer and inserting a conductive material into the hole portion, it is preferable that the thin film electrode has three or more electrode lead-out portions in order to more reliably ensure the conduction.

The upper protective layer 18 and the lower protective layer 20 in the piezoelectric film 10 have a function of covering the upper thin film electrode 14 and the lower thin film electrode 16 and applying appropriate rigidity and mechanical strength to the piezoelectric layer 12. That is, in the piezoelectric film 10 according to the embodiment of the present invention, the piezoelectric layer 12 containing the polymer matrix 24 and the piezoelectric particles 26 exhibits extremely excellent flexibility under bending deformation at a slow vibration, but may have insufficient rigidity or mechanical strength depending on the applications. As a compensation for this, the piezoelectric film 10 is provided with the upper protective layer 18 and the lower protective layer 20.

The lower protective layer 20 and the upper protective layer 18 have the same configuration except for the disposition position. Therefore, in the description below, in a case where it is not necessary to distinguish the lower protective layer 20 from the upper protective layer 18, both members are collectively referred to as a protective layer.

According to a more preferred embodiment, the piezoelectric film 10 in the example illustrated in the figure has the lower protective layer 20 and the upper protective layer 18 in a manner of being laminated on both thin film electrodes. However, the present invention is not limited thereto, and a configuration having only one of the lower protective layer 20 or the upper protective layer 18 may be employed.

In the piezoelectric film according to the embodiment of the present invention, the protective layer is provided as a preferred embodiment rather than an essential constituent requirement. That is, the piezoelectric film according to the embodiment of the present invention may be formed of the piezoelectric layer 12, the upper thin film electrode 14, and the lower thin film electrode 16.

The protective layer is not limited, and various sheet-like materials can be used as the protective layer, and suitable examples thereof include various resin films Among these, from the viewpoints of excellent mechanical characteristics and heat resistance, a resin film consisting of polyethylene terephthalate (PET), polypropylene (PP), polystyrene (PS), polycarbonate (PC), polyphenylene sulfide (PPS), polymethylmethacrylate (PMMA), polyetherimide (PEI), polyimide (PI), polyamide (PA), polyethylene naphthalate (PEN), triacetyl cellulose (TAC), and a cyclic olefin-based resin is suitably used.

The thickness of the protective layer is not limited. In addition, the thicknesses of the upper protective layer 18 and the lower protective layer 20 are basically the same as each other, but may be different from each other.

Here, in a case where the rigidity of the protective layer is extremely high, not only is the stretch and contraction of the piezoelectric layer 12 constrained, but also the flexibility is impaired. Therefore, it is advantageous that the thickness of the protective layer decrease except for the case where the mechanical strength or excellent handleability as a sheet-like material is required.

Based on the examination conducted by the present inventors, in a case where the thickness of the upper protective layer 18 and the thickness of the lower protective layer 20 are respectively two times or less the thickness of the piezoelectric layer 12, preferable results in terms of achieving both ensuring of the rigidity and appropriate elasticity can be obtained.

For example, in a case where the thickness of the piezoelectric layer 12 is 50 μm and the lower protective layer 20 and the upper protective layer 18 consist of PET, the thickness of the lower protective layer 20 and the thickness of the upper protective layer 18 are respectively preferably 100 μm or less, more preferably 50 μm or less, and still more preferably 25 μm or less.

In the piezoelectric film 10, the upper thin film electrode 14 is formed between the piezoelectric layer 12 and the upper protective layer 18, and the lower thin film electrode 16 is formed between the piezoelectric layer 12 and the lower protective layer 20. In the description below, the upper thin film electrode 14 is also referred to as an upper electrode 14, and the lower thin film electrode 16 is also referred to as a lower electrode 16.

The upper electrode 14 and the lower electrode 16 are provided to apply an electric field to the piezoelectric film 10 (piezoelectric layer 12).

Further, the lower electrode 16 and the upper electrode 14 are basically the same as each other except for the different positions. Therefore, in the description below, in a case where it is not necessary to distinguish the lower electrode 16 from the upper electrode 14, both members are collectively referred to as a thin film electrode.

In the piezoelectric film according to the embodiment of the present invention, the material for forming the thin film electrode is not limited, and various conductors can be used as the material. Specific examples thereof include conductive polymers such as carbon, palladium, iron, tin, aluminum, nickel, platinum, gold, silver, copper, chromium, molybdenum, alloys thereof, indium tin oxide, and polyethylene dioxythiophene-polystyrene sulfonic acid (PEDOT/PPS).

Among these, copper, aluminum, gold, silver, platinum, and indium tin oxide are suitable. Among these, from the viewpoints of the conductivity, the cost, and the flexibility, copper is more preferable.

In addition, the method of forming the thin film electrode is not limited, and various known methods, for example, a vapor-phase deposition method (a vacuum film forming method) such as vacuum vapor deposition or sputtering, a film forming method using plating, a method of bonding a foil formed of the materials described above, and a coating method can be used.

Among these, particularly from the viewpoint of ensuring the flexibility of the piezoelectric film 10, a thin film made of copper, aluminum, or the like formed by vacuum vapor deposition is suitably used as the thin film electrode. Among these, particularly a thin film made of copper formed by vacuum vapor deposition is suitably used.

The thickness of the upper electrode 14 and the lower electrode 16 is not limited. In addition, the thicknesses of the upper electrode 14 and the lower electrode 16 may be basically the same as or different from each other.

Here, similarly to the protective layer described above, in a case where the rigidity of the thin film electrode is extremely high, not only is the stretch and contraction of the piezoelectric layer 12 constrained, but also the flexibility is impaired. Therefore, it is advantageous that the thicknesses of the thin film electrode decreases in a case where the electrical resistance is not excessively high.

It is suitable that the product of the thicknesses of the thin film electrode of the piezoelectric film 10 according to the embodiment of the present invention and the Young's modulus thereof is less than the product of the thickness of the protective layer and the Young's modulus thereof because the flexibility is not considerably impaired.

For example, in a case of a combination consisting of the protective layer formed of PET (Young's modulus: approximately 6.2 GPa) and the thin film electrode formed of copper (Young's modulus: approximately 130 GPa), the thickness of the thin film electrode is preferably 1.2 μm or less, more preferably 0.3 μm or less, and still more preferably 0.1 μm or less in a case of assuming that the thickness of the protective layer is 25 μm.

As described above, the piezoelectric film 10 has a configuration in which the piezoelectric layer 12 containing the piezoelectric particles 26 in the polymer matrix 24 containing the polymer material is sandwiched between the upper electrode 14 and the lower electrode 16 and further sandwiched between the upper protective layer 18 and the lower protective layer 20.

It is preferable that, in such a piezoelectric film 10, the maximal value at which the loss tangent (tan δ) at a frequency of 1 Hz according to dynamic viscoelasticity measurement is 0.1 or greater is present at room temperature.

In this manner, even in a case where the piezoelectric film 10 is subjected to bending deformation at a slow vibration of less than or equal to a few Hz from the outside, since the strain energy can be effectively diffused to the outside as heat, occurrence of cracks on the interface between the polymer matrix and the piezoelectric particles can be prevented.

In the piezoelectric film 10, it is preferable that the storage elastic modulus (E') at a frequency of 1 Hz according to the dynamic viscoelasticity measurement is 10 to 30 GPa at 0° C. and 1 to 10 GPa at 50° C.

In this manner, the piezoelectric film 10 may have large frequency dispersion in the storage elastic modulus (E') at room temperature. That is, the piezoelectric film 10 can exhibit a behavior of being rigid with respect to a vibration of 20 Hz to 20 kHz and being flexible with respect to a vibration of less than or equal to a few Hz.

In the piezoelectric film 10, it is preferable that the product of the thickness and the storage elastic modulus (E') at a frequency of 1 Hz according to the dynamic viscoelasticity measurement is in a range of $1.0 \times 10^6$ to $2.0 \times 10^6$ N/m at 0° C. and in a range of $1.0 \times 10^5$ to $1.0 \times 10^6$ N/m at 50° C.

In this manner, the piezoelectric film 10 may have appropriate rigidity and mechanical strength within a range not impairing the flexibility and the acoustic characteristics.

Further, in the piezoelectric film 10, it is preferable that the loss tangent (Tan δ) at a frequency of 1 kHz at 25° C. is 0.05 or greater in a master curve obtained from the dynamic viscoelasticity measurement.

In this manner, the frequency of a speaker using the piezoelectric film 10 is smooth as the frequency characteristic thereof, and thus a change in acoustic quality in a case where the lowest resonance frequency $f_0$ is changed according to a change in the curvature of the speaker (piezoelectric film 10) can be decreased.

As described above, in the piezoelectric film 10 according to the embodiment of the present invention, in a case where a cross section of the film in the thickness direction is observed with a SEM, the piezoelectric layer 12 is divided into ten equal regions in the thickness direction, area ratios of the piezoelectric particles 26 in two most distant regions are measured, and the area ratio of the piezoelectric particles 26 in the region with a lower area ratio is set as 1, the area ratio of the piezoelectric particles 26 in the region with a higher area ratio is 1.2 or greater.

Specifically, as an example, a SEM image of a cross section of the piezoelectric film 10 cut at an arbitrary position in the thickness direction is obtained. In the cross-sectional SEM image, the piezoelectric layer 12 is divided into ten equal regions in the thickness direction as indicated by the dashed line in FIG. 1 such that the interface between the upper electrode 14 and the piezoelectric layer 12 and the interface between the lower electrode and the piezoelectric layer 12 are respectively set as the upper surface and the lower surface of the piezoelectric layer 12 in the thickness direction.

In the present invention, attention is paid to the two most distant regions from among the equally divided ten regions in the thickness direction. That is, in the present invention, attention is paid to the region adjacent to the upper electrode 14 and the region adjacent to the lower electrode 16 from among the equally divided ten regions in the thickness direction.

In the following description, for convenience, in the two most distant regions of the piezoelectric layer 12 from among the equally divided ten regions in the thickness direction, the region adjacent to the upper electrode 14 is referred to as a first region 12a, and the region on the side of the lower electrode 16 is referred to as a tenth region 12b. Similar to the description of the terms "upper" and "lower" above, the terms "first" and "tenth" do not have technical implications.

The area ratios of the piezoelectric particles 26 in the first region 12a and the tenth region 12b defined as described above are respectively measured.

The area ratio of the piezoelectric particles 26 is the total area ratio of the piezoelectric particles 26 in the first region 12a and the tenth region 12b in the cross-sectional SEM image. For example, in a case of the area ratio of the piezoelectric particles 26 in the first region 12a, the area ratio of the piezoelectric particles 26 in the first region 12a may be calculated by image-analyzing the cross-sectional SEM image and acquiring the total area of the piezoelectric particles 26 obtained by adding up the area of the first region 12a and the area of all the piezoelectric particles 26 in the first region 12a.

In general, in the cross-sectional SEM image (monochrome image) of the piezoelectric film 10, the density (brightness) of the image satisfies the relationship of "piezoelectric particles and thin film electrodes>polymer matrix (binder) and protective layer". Further, in a case where voids are present in the piezoelectric layer 12, the voids have the highest density.

Therefore, for example, in the cross-sectional SEM image of the piezoelectric film 10, the piezoelectric layer 12 is divided into ten equal regions in the thickness direction as described above so that the first region 12a on the side of the upper electrode 14 and the tenth region 12b on the side of the lower electrode 16 side which are most distant from each other are set. Thereafter, the cross-sectional SEM image is binarized into black (high density) and white (low density) using an appropriately selected density as a threshold value. The area ratio of the piezoelectric particles in each region may be acquired by analyzing the binarized image and acquiring the area of the first region 12a, the area of the tenth region 12b, and the total area of the piezoelectric particles 26 in each region.

In the present invention, as an example, the area ratio of the piezoelectric particles 26 in the first region 12a and the tenth region 12b is measured with 10 cross sections optionally set in the piezoelectric film 10.

The average value of the area ratios of the piezoelectric particles 26 in the first region 12a and the tenth region 12b in the ten cross sections is defined as the area ratio of the piezoelectric particles 26 in the first region 12a and the tenth region 12b of the piezoelectric film 10. That is, in the present invention, as an example, the average value of the area ratios in the ten cross sections is defined as the area ratio of the piezoelectric particles 26 in the first region 12a and the tenth region 12b which are most distant from each other in the piezoelectric layer 12 divided into ten equal regions in the thickness direction in the piezoelectric film 10.

In the piezoelectric film 10 according to the embodiment of the present invention, in the area ratio of the piezoelectric particles 26 in the first region 12a and the tenth region 12b measured as described above, in a case where the area ratio of the piezoelectric particles 26 in the region with a lower area ratio is set as 1, the area ratio of the piezoelectric particles 26 in the region with a higher area ratio is 1.2 or greater.

That is, in the piezoelectric film 10 according to the embodiment of the present invention, in a case where the area ratio of the piezoelectric particles 26 in the region with a lower area ratio is standardized to 1 in the area ratio of the piezoelectric particles 26 in the first region 12a and the tenth region 12b measured as described above, the area ratio of the piezoelectric particles 26 in the region with a higher area ratio is 1.2 or greater.

That is, in the piezoelectric film 10 according to the embodiment of the present invention, in the area ratio of the piezoelectric particles 26 in the first region 12a and the tenth region 12b, the ratio of the area ratio obtained by dividing the area ratio of the piezoelectric particles 26 in the region with a higher area ratio by the area ratio in the region with a lower area ratio is 1.2 or greater.

For example, in a case where the area ratio of the piezoelectric particles 26 in the first region 12a is higher than the area ratio of the piezoelectric particles 26 in the tenth region 12b, the ratio of the area ratio obtained by dividing the area ratio of the piezoelectric particles 26 in the first region 12a by the area ratio of the piezoelectric particles 26 in the tenth region 12b is 1.2 or greater. That is, in this case, the relationship of "ratio of area ratio of piezoelectric particles 26=[area ratio of piezoelectric particles 26 in first region 12a]/[area ratio of piezoelectric particles 26 in tenth region 12b]≤1.2" is satisfied.

With such a configuration, the piezoelectric film 10 according to the embodiment of the present invention has high durability to prevent damage to the piezoelectric layer 12 due to warpage and has a characteristic of obtaining a sufficient sound pressure with respect to the input operating voltage.

As described above, in a case where the piezoelectric film is used as an electroacoustic conversion film for a piezoelectric speaker, the piezoelectric film is allowed to stretch and contract in the plane direction by maintaining the piezoelectric film in a bent state and applying a driving voltage to the electrode layer. The piezoelectric film vibrates in a direction orthogonal to the surface due to the stretch and contraction of the piezoelectric film, and thus the piezoelectric speaker outputs a sound.

The piezoelectric film is greatly warped by the vibration of the piezoelectric film. In a case where the piezoelectric film is in a warped state, a region where the degree of a volume change varies in the thickness direction is present in the piezoelectric layer constituting the piezoelectric film. Due to such a difference in volume change in the thickness direction, a large stress is imparted to the piezoelectric layer, and defects such as cracking and peeling of the piezoelectric film from the electrode layer occur.

Therefore, as the piezoelectric film of the related art is used, deterioration of acoustic characteristics such as a decrease in sound pressure occurs.

Meanwhile, in the piezoelectric film 10 according to the embodiment of the present invention, in the area ratio of the piezoelectric particles 26 in the first region 12a and the tenth region 12b which are most distant from each other in the thickness direction of the piezoelectric layer 12 divided into ten equal regions, in a case where the area ratio of the piezoelectric particles 26 in the region with a lower area ratio is set as 1, the area ratio of the piezoelectric particles 26 in the region with a higher area ratio is 1.2 or greater.

That is, in the piezoelectric film 10 according to the embodiment of the present invention, in the area ratio of the piezoelectric particles 26 in the first region 12a and the tenth region 12b which are most distant from each other in the thickness direction of the piezoelectric layer 12 divided into ten equal regions, the ratio of the area ratio obtained by dividing the area ratio of the piezoelectric particles 26 in the region with a higher area ratio by the area ratio of the piezoelectric particles 26 in the region with a lower area ratio is 1.2 or greater.

That is, the piezoelectric layer 12 has a region where the amount of the polymer matrix 24 is relatively large and a region where the amount of the polymer matrix 24 is relatively small in the thickness direction.

The piezoelectric particles 26 have high rigidity, but the polymer matrix 24 has some level of elasticity. Accordingly, in a case where such a piezoelectric film 10 according to the embodiment of the present invention is in a warped state, the polymer matrix 24 present in the region where the amount of the polymer matrix 24 is high absorbs the volume change of the piezoelectric layer 12 in the thickness direction due to the warpage.

As a result, the piezoelectric film 10 according to the embodiment of the present invention reduces the stress applied to the piezoelectric layer 12 due to the warpage of the piezoelectric film 10 and presents occurrence of cracks in the piezoelectric layer 12 and occurrence of defects such as peeling of the piezoelectric layer 12 from the thin film electrode for a long period of time. Therefore, the piezoelectric film 10 according to the embodiment of the present invention has satisfactory durability to suppress deterioration of acoustic characteristics such as a decrease in sound pressure associated with the usage of the film.

Here, from the viewpoint of the durability, it is preferable that the area ratio of the piezoelectric particles 26 is uniformly low in the entire piezoelectric film. However, in a case where the area ratio of the piezoelectric particles 26 is uniformly low in the entire piezoelectric film, for example, the sound pressure with respect to the input operating voltage is low, which indicates that sufficient acoustic characteristics cannot be obtained.

On the contrary, in the most distant regions which are the first region 12a and the tenth region 12b, among the equally divided ten regions in the thickness direction, the piezoelectric film 10 according to the embodiment of the present invention is formed such that the area ratio of the piezoelectric particles 26 in one region is 1.2 times or greater the area ratio of the piezoelectric particles 26 in the other region. That is, the piezoelectric film 10 according to the embodiment of the present invention has a region where the area ratio of the piezoelectric particles 26 is relatively higher than the area ratio of the piezoelectric particles 26 in the other region in the thickness direction.

Therefore, in the piezoelectric film 10 according to the embodiment of the present invention, since the region where the area ratio of the piezoelectric particles 26 is high can ensure the acoustic characteristics, the piezoelectric film 10 has high durability due to having the region where the area ratio of the piezoelectric particles 26 is low, and a sufficient sound pressure with respect to the input operating voltage is obtained.

That is, according to the present invention, a piezoelectric film 10 achieving both satisfactory durability and acoustic characteristics, in which a sufficient sound pressure with respect to the input operating voltage is obtained, the acoustic characteristics such as a decrease in sound pressure associated with the usage of the film do not deteriorate, and the durability to maintain the initial performance for a long period of time is satisfactory, can be realized.

In the piezoelectric film 10 according to the embodiment of the present invention, in a case where the area ratio of the piezoelectric particles 26 in the region with a lower area ratio is set as 1 in the first region 12a and the tenth region 12b, the area ratio of the piezoelectric particles 26 in the region with a higher area ratio is 1.2 or greater.

That is, in the piezoelectric film 10 according to the embodiment of the present invention, the ratio of the area ratio obtained by dividing the area ratio of the piezoelectric particles 26 in the region with a higher area ratio by the area ratio of the piezoelectric particles 26 in the region with a lower area ratio in the first region 12*a* and the tenth region 12*b* is 1.2 or greater.

In the following description, the ratio of the area ratio of the piezoelectric particles 26 in the first region 12*a* and the tenth region 12*b*, that is, "the ratio of the area ratio obtained by dividing the area ratio of the piezoelectric particles 26 in the region with a higher area ratio by the area ratio of the piezoelectric particles 26 in the region with a lower area ratio" is also simply referred to as "the ratio of the area ratio of the piezoelectric particles 26".

In a case where the ratio of the area ratio of the piezoelectric particles 26 is less than 1.2, an inconvenience, for example, deterioration of acoustic characteristics such as a decrease in sound pressure associated with the usage of the film occurs.

The ratio of the area ratio of the piezoelectric particles 26 is preferably 1.3 or greater, more preferably 1.4 or greater, and still more preferably 1.5 or greater.

In the piezoelectric film 10 according to the embodiment of the present invention, it is preferable that the ratio of the area ratio of the piezoelectric particles 26 is basically large from the viewpoint of preventing deterioration of acoustic characteristics. However, in a case where the ratio of the area ratio of the piezoelectric particles 26 is extremely large, a region where the abundance ratio of the piezoelectric particles 26 is partially extremely low may be present in the thickness direction of the piezoelectric layer 12, and this region may not contribute to the acoustic characteristics.

In consideration of this point, the ratio of the area ratio of the piezoelectric particles 26 is preferably 70 or less, more preferably 50 or less, and still more preferably 12 or less.

Further, in the piezoelectric film 10 according to the embodiment of the present invention, the performance of the piezoelectric film 10 is not affected even in a case where any of the first region 12*a* or the tenth region 12*b* has a higher area ratio of the piezoelectric particles 26 than that of the other region. Further, as described above, the terms "first" and "second" in the piezoelectric film 10 according to the embodiment of the present invention have no technical implications and are irrelevant to the actual use state such as the vertical direction.

Therefore, in the piezoelectric film 10 according to the embodiment of the present invention, the region where the area ratio of the piezoelectric particles 26 is high may be any of the first region 12*a* or the tenth region 12*b*.

In the piezoelectric film 10 according to the embodiment of the present invention, the area ratio of the piezoelectric particles 26 in the first region 12*a* and the tenth region 12*b* is not limited. Basically, the acoustic characteristics of the piezoelectric film 10 are improved as the area ratio of the piezoelectric particles 26 in the piezoelectric layer 12 increases.

In the piezoelectric film 10, it is preferable that the average of the area ratio of the piezoelectric particles 26 in the first region 12*a* and the area ratio of the piezoelectric particles 26 in the tenth region 12*b* is 23% or greater.

In the following description, the average of the area ratio of the piezoelectric particles 26 in the first region 12*a* and the area ratio of the piezoelectric particles 26 in the tenth region 12*b* is also referred to as "average area ratio of the piezoelectric particles 26".

The piezoelectric film 10 can exhibit satisfactory acoustic characteristics by setting the average area ratio of the piezoelectric particles 26 to 23% or greater.

The average area ratio of the piezoelectric particles 26 is more preferably 40% or greater and still more preferably 60% or greater.

The upper limit of the average area ratio of the piezoelectric particles 26 is not limited.

From the viewpoint that the ratio of the area ratio of the piezoelectric particles 26 is stably set to 1.2 or greater, the average area ratio of the piezoelectric particles 26 is preferably 80% or less.

Further, the average area ratio of the piezoelectric particles 26 is the average area ratio of the piezoelectric particles 26 in the first region 12*a* and the tenth region 12*b* which are most distant from each other in the case where the piezoelectric layer 12 is divided into ten equal regions in the thickness direction, and does not necessarily match the area ratio of the piezoelectric particles 26 in the entire piezoelectric layer 12.

However, according to the examination of the present inventor, the area ratio of the piezoelectric particles 26 in the first region 12*a* and the tenth region 12*b* which are the most distant regions from among the equally divided ten regions in the thickness direction correlates with the area ratio of the piezoelectric particles 26 in the entire piezoelectric layer 12 in the thickness direction in most cases.

Therefore, the area ratio of the piezoelectric particles 26 in the entire piezoelectric layer 12 can be obtained by using the average area ratio of the piezoelectric particles 26 which is the average of the area ratio of the piezoelectric particles 26 in the first region 12*a* and the area ratio of the piezoelectric particles 26 in the tenth region 12*b*.

Figure 2:
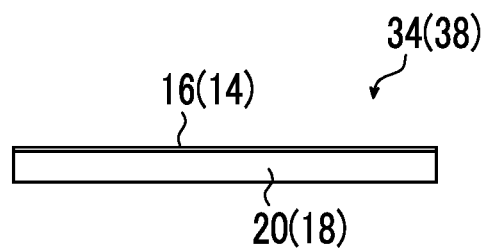
FIG. 2 is a conceptual view for describing a method of producing the piezoelectric film illustrated in FIG. 1.
Figure 3:
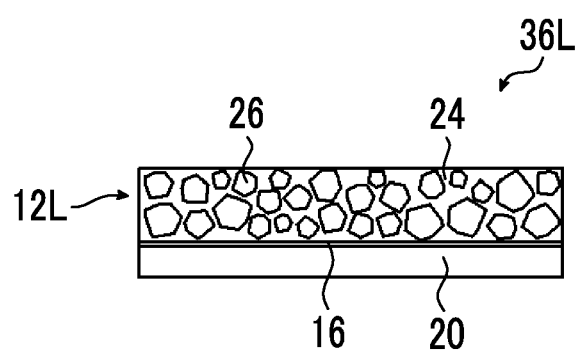
FIG. 3 is a conceptual view for describing a method of producing the piezoelectric film illustrated in FIG. 1.
Figure 4:
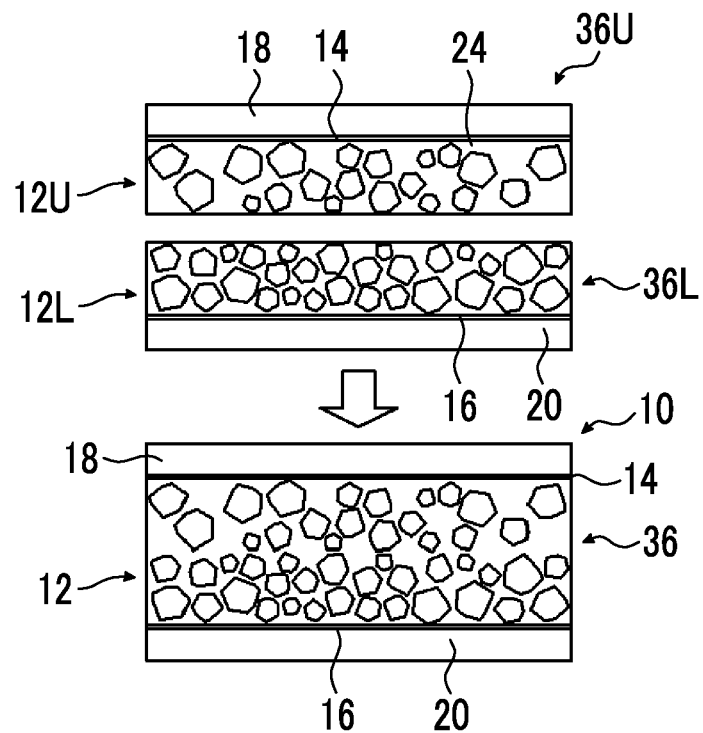
FIG. 4 is a conceptual view for describing a method of producing the piezoelectric film illustrated in FIG. 1.

FIGS. 2 to 4 conceptually illustrates an example of the method of producing the piezoelectric film 10.

First, as conceptually illustrated in FIG. 2, a sheet-like material 34 in which the lower electrode 16 is formed on the lower protective layer 20 is prepared.

The sheet-like material 34 may be prepared by forming a copper thin film or the like as the lower electrode 16 on the surface of the lower protective layer 20 using vacuum vapor deposition, sputtering, plating, or the like. Similarly, the sheet-like material 38 may be prepared by forming a copper thin film or the like as the upper thin film electrode 14 on the surface of the upper protective layer 18 using vacuum vapor deposition, sputtering, plating, or the like.

Alternatively, a commercially available sheet-like material in which a copper thin film or the like is formed on a protective layer may be used as the sheet-like material 34 (a sheet-like material 38 described below).

In a case where the protective layer is extremely thin and thus the handleability is degraded, a protective layer with a separator (temporary support) may be used as necessary. Further, a PET having a thickness of 25 µm to 100 µm or the like can be used as the separator. The separator may be removed after thermal compression bonding of the thin film electrode and the protective layer.

Next, as conceptually illustrated in FIG. 3, a lower laminate 36L is prepared by coating the lower electrode 16 of the sheet-like material 34 with the coating material (coating composition) that is the piezoelectric layer 12, heating and drying the material so that the material is cured to form a lower piezoelectric layer 12L having a thickness that is approximately one half the thickness of the piezoelectric layer 12 on the side of the lower electrode 16 in the thickness direction, and laminating the sheet-like material 34 and the lower piezoelectric layer 12L. That is, in the present example, the lower piezoelectric layer 12L having a thickness that is approximately one half the thickness of the piezoelectric layer 12 originally formed is formed on the lower electrode 16 of the sheet-like material 34.

In the formation of the lower piezoelectric layer 12L having a thickness that is one half the thickness of the piezoelectric layer 12 on the side of the lower electrode, first, the coating material that is the piezoelectric layer is prepared by dissolving the polymer material which is the above-described polymer matrix 24 in an organic solvent, further adding the piezoelectric particles 26 such as PZT particles thereto, and stirring the solution.

The organic solvent is not limited, and various organic solvents such as dimethylformamide (DMF), methyl ethyl ketone, and cyclohexanone can be used. A plurality of organic solvents may be mixed and used.

In a case where the sheet-like material 34 is prepared and the coating material is prepared, the coating material is cast (applied) onto the sheet-like material 34 (lower electrode 16), and heating the coating material so that the organic solvent is evaporated and dried. In this manner, as illustrated in FIG. 3, the lower laminate 36L which has the lower electrode 16 on the lower protective layer 20 is prepared by laminating the lower piezoelectric layer 12L having a thickness that is approximately one half the thickness of the piezoelectric layer 12 on the side of the lower electrode 16, on the lower electrode 16.

A casting method of the coating material is not limited, and all known methods (coating devices) such as a bar coater, a slide coater, and a doctor knife can be used.

Alternatively, in a case where the polymer material is a material that can be heated and melted, the lower laminate 36L as illustrated in FIG. 3 may be prepared by heating and melting the polymer material to prepare a melt obtained by adding the piezoelectric particles 26 to the melted material, extruding the melt on the sheet-like material 34 illustrated in FIG. 2 in a sheet shape by carrying out extrusion molding or the like, and cooling the laminate.

As described above, in the piezoelectric film 10, a polymer piezoelectric material such as PVDF may be added to the polymer matrix 24 in addition to the polymer material having a viscoelasticity at room temperature.

In a case where the polymer piezoelectric material is added to the polymer matrix 24, the polymer piezoelectric material to be added to the coating material may be dissolved. Alternatively, the polymer piezoelectric material to be added may be added to the heated and melted polymer material having a viscoelasticity at room temperature so that the polymer piezoelectric material is heated and melted.

Next, the lower piezoelectric layer 12L formed on the lower laminate 36L is subjected to a polarization treatment (poling).

The method of performing a polarization treatment on the piezoelectric layer 12 is not limited, and a known method can be used. For example, electric field poling in which a direct current electric field is directly applied to a target to be subjected to the polarization treatment is exemplified. Further, in a case where the polarization treatment is performed by electric field poling, the electric field poling treatment may be performed using the upper electrode 14 and the lower electrode 16 by laminating the upper piezoelectric layer 12U on the lower piezoelectric layer 12L before the polarization treatment as described below, without performing the polarization treatment separately on the lower piezoelectric layer 12L of the lower laminate 36L and the upper piezoelectric layer 12U of the upper laminate 36U.

Further, in a case where the piezoelectric film 10 according to the embodiment of the present invention is produced, it is preferable that the polarization treatment is performed in the thickness direction of the piezoelectric layer 12 2(polymer-based piezoelectric composite material) instead of the plane direction.

In addition, a calender treatment of smoothing the surface of the lower piezoelectric layer 12L using a heating roller or the like may be performed before the polarization treatment. By performing the calender treatment, a thermal compression bonding step described below can be smoothly performed.

Meanwhile, the sheet-like material 38 having the upper electrode 14 formed on the surface of the upper protective layer 18, similar to the sheet-like material 34 described above, is prepared (see FIG. 2).

The upper piezoelectric layer 12U having a thickness that is one half the thickness of the piezoelectric layer 12 on the side of the upper electrode 14 is formed on the sheet-like material 38 in the same manner as that for the lower piezoelectric layer 12L of the lower laminate 36L, to prepare the upper laminate 36U. Further, the upper piezoelectric layer 12U of the upper laminate 36U is subjected to the polarization treatment in the thickness direction.

In addition, the polarization treatment performed on the upper piezoelectric layer 12U is carried out such that the polarization direction is set to be opposite to that of the lower piezoelectric layer 12L. For example, in a case where the electric field poling is performed and a negative electrode of a direct current power source is connected to the lower piezoelectric layer 12L on the side of the lower electrode 16 during the polarization treatment, the polarization treatment is performed by connecting a positive electrode of a direct current power source 32 to the upper piezoelectric layer 12U on the side of the upper electrode 14 during the polarization treatment.

In the formation of the upper piezoelectric layer 12U, the amount of the piezoelectric particles 26 with respect to the polymer matrix 24 (polymer material which is the polymer matrix 24) in the coating material for forming the upper piezoelectric layer 12U is set to be different from the amount of the piezoelectric particles 26 in the coating material for forming the lower piezoelectric layer 12L.

As an example, in the coating material for forming the upper piezoelectric layer 12U, the amount of the piezoelectric particles 26 with respect to the polymer matrix 24 is set to be lower than the amount of the piezoelectric particles 26 in the coating material for forming the lower piezoelectric layer 12L. For example, the content of the polymer matrix 24 is set to 100 parts by mass and the content of the piezoelectric particles 26 is set to 100 parts by mass in the coating material for forming the lower piezoelectric layer 12L, and the content of the polymer matrix 24 is set to 100 parts by mass and the content of the piezoelectric particles 26 is set to 30 parts by mass in the coating material for forming the upper piezoelectric layer 12U.

On the contrary, the amount of the piezoelectric particles 26 in the coating material for forming the upper piezoelectric layer 12U with respect to the polymer matrix 24 may be set to be higher than the amount of the piezoelectric particles 26 in the coating material for forming the lower piezoelectric layer 12L. For example, the content of the polymer matrix 24 is set to 200 parts by mass and the content of the piezoelectric particles 26 may be set to 100 parts by mass in the coating material for forming the lower piezoelectric layer 12L, and the content of the polymer matrix 24 may be set to 200 parts by mass and the content of the piezoelectric particles 26 is set to 200 parts by mass in the coating material for forming the upper piezoelectric layer 12U.

In this manner, the content ratio of the piezoelectric particles in the first region 12a is set to be different from the content of the piezoelectric particles in the tenth region 12b so that the piezoelectric layer 12 in which the area ratio of the piezoelectric particles 26 in the first region 12a is different from the area ratio of the piezoelectric particles 26 in the tenth region 12b can be formed.

Further, the ratio of the area ratio of the piezoelectric particles 26 in the piezoelectric layer 12 of the piezoelectric film 10 can be set to 1.2 or greater by appropriately adjusting the amount of the piezoelectric particles 26 in the coating material for forming the upper piezoelectric layer 12U with respect to the polymer matrix 24 and the amount of the piezoelectric particles 26 in the coating material for forming the lower piezoelectric layer 12L with respect to the polymer matrix 24.

Further, any of the area ratio of the piezoelectric particles 26 in the tenth region 12b or the first region 12a may be higher than the other as described above.

In this manner, in a case where the lower laminate 36L in which the lower piezoelectric layer 12L has been subjected to the polarization treatment and the upper laminate 36U in which the upper piezoelectric layer 12U has been subjected to the polarization treatment are prepared, the lower laminate 36L and the upper laminate 36U are laminated by allowing the lower piezoelectric layer 12L and the upper piezoelectric layer 12U to face each other as illustrated in FIG. 4.

Next, the piezoelectric film 10 according to the embodiment of the present invention as illustrate in FIG. 1 is prepared by performing thermal compression bonding on the laminate using a heating press device, heating rollers, or the like such that the lower protective layer 20 and the upper protective layer 18 are sandwiched and bonding the lower piezoelectric layer 12L and the upper piezoelectric layer 12U to each other.

In the example described above, the lower piezoelectric layer 12L of the piezoelectric layer 12 is formed on the sheet-like material 34, the upper piezoelectric layer 12U of the piezoelectric layer 12 is formed on the sheet-like material 38, and the formed layers are laminated. That is, in the present example, the piezoelectric film 10 according to the embodiment of the present invention is prepared by forming a piezoelectric layer having a thickness that is approximately one half the thickness of the piezoelectric layer to be finally obtained on two sheet-like materials to be laminated.

However, the piezoelectric film 10 according to the embodiment of the present invention is not limited to being produced by this method and can be produced by forming piezoelectric layers having thicknesses with various ratios on two sheet-like materials and laminating the layers. For example, the piezoelectric film 10 may be prepared by forming approximately nine-tenths of the piezoelectric layer 12 on the sheet-like material 34 on the side of the lower electrode 16, forming one-tenth of the piezoelectric layer 12 on the sheet-like material 38 on the side of the upper electrode 14, and laminating and thermally compression bonding the layers. Alternatively, the piezoelectric layer 12 may be formed by laminating three or more layers.

Even in this production method, the amount of the piezoelectric particles 26 in the coating material for forming each layer with respect to the polymer matrix 24 is appropriately set so that the piezoelectric layer is divided into ten equal regions in the thickness direction, and the piezoelectric film 10 according to the embodiment of the present invention in which the ratio of the area ratio of the piezoelectric particles 26 in the first region 12a and the tenth region 12b which are most distant from each other is 1.2 or greater can be suitably produced.

Further, the piezoelectric film 10 according to the embodiment of the present invention is not limited to being prepared by laminating two piezoelectric layers having different contents of the piezoelectric particles 26 as described above.

That is, the polarization treatment is performed by forming the piezoelectric layer 12 on the sheet-like material 34 having the lower electrode 16 and the lower protective layer 20 using the polymer material which is the polymer matrix 24 and the coating material containing the piezoelectric particles 26 in the same manner as in the example described above. Next, as conceptually illustrated in FIG. 5, the piezoelectric film 10 according to the embodiment of the present invention may be produced by laminating the sheet-like material 38 having the upper electrode 14 and the upper protective layer 18 and thermally compression bonding the laminate.

Here, in this production method, the piezoelectric film 10 according to the embodiment of the present invention in which the ratio of the area ratio of the piezoelectric particles 26 in the first region 12a and the tenth region 12b of the piezoelectric layer 12 is 1.2 or greater can be produced by forming the piezoelectric layer 12 using a typical method.

However, the ratio of the area ratio of the piezoelectric particles 26 can be set to 1.2 or greater by adjusting the abundance ratio of the piezoelectric particles 26 in the piezoelectric layer 12 in the thickness direction using the method described below.

As an example, a method of coating the lower electrode 16 (upper electrode 14) with the coating material for forming the piezoelectric layer 12 and setting the time of drying the coating material to be longer than usual is exemplified.

As described above, the piezoelectric layer 12 is formed by using a coating material prepared by dissolving the polymer material which is the polymer matrix 24 described above in an organic solvent, further adding piezoelectric particles 26 such as PZT particles to the solution, and stirring the solution.

In a case where the piezoelectric layer 12 is formed by using such a coating material, typically, the coating material is applied to the piezoelectric layer 12, heated, dried, and cured in order to promote evaporation of the organic solvent and maintain a uniformly dispersed state of the piezoelectric particles.

Meanwhile, the time of drying the coating material for forming the piezoelectric layer 12 is set to be longer than usual by, for example, a method of performing drying and curing of the coating material at room temperature, preferably at room temperature or lower or a method of applying the coating material in a state of a low temperature of 5° C. or lower.

The specific gravity of the piezoelectric particles 26 is higher than that of the polymer material which is the polymer matrix 24. Therefore, in a case where the coating material is dried for a long time, a time for sufficiently precipitating the piezoelectric particles 26 in the coating material which is the piezoelectric layer 12 can be ensured, and the ratio of the area ratio of the piezoelectric particles 26 in the piezoelectric layer 12 can be set to 1.2 or greater.

The length of the drying time in this case may be appropriately set to a time such that the piezoelectric particles 26 can be sufficiently precipitated in the coating material which is the piezoelectric layer 12 depending on the particle diameter of the piezoelectric particles 26, the ratio between the amount of the polymer matrix 24 and the amount of the piezoelectric particles 26 in the coating material, the film thickness of the piezoelectric layer 12, the boiling point of the organic solvent, and the like.

Examples of other methods include a method of increasing the amount of the organic solvent in the coating material for forming the piezoelectric layer 12 more than usual to decrease the viscosity of the coating material.

In a case where the viscosity of the coating material is low, the piezoelectric particles 26 are likely to be precipitated in the coating material applied to the lower electrode 16 (upper electrode 14). Therefore, in the coating material for forming the piezoelectric layer 12, the ratio of the area ratio of the piezoelectric particles 26 in the piezoelectric layer 12 can be set to 1.2 or greater by increasing the amount of the organic solvent more than usual and decreasing the viscosity of the coating material.

Further, the viscosity of the coating material in this case may be appropriately set to the viscosity such that the piezoelectric particles 26 can be sufficiently precipitated in the coating material which is the piezoelectric layer 12 depending on the particle diameter of the piezoelectric particles 26, the ratio between the amount of the polymer material which is the polymer matrix 24 and the amount of the piezoelectric particles 26 in the coating material, the film thickness of the piezoelectric layer 12, the boiling point of the organic solvent, and the like.

The piezoelectric film 10 according to the embodiment of the present invention to be prepared in the above-described manner is polarized in the thickness direction instead of the plane direction, and thus excellent piezoelectric characteristics are obtained even in a case where the stretching treatment is not performed after the polarization treatment. Therefore, the piezoelectric film 10 according to the embodiment of the present invention has no in-plane anisotropy as a piezoelectric characteristic, and stretches and contracts isotropically in all directions in the in-plane direction in a case where a driving voltage is applied.

The piezoelectric film 10 according to the embodiment of the present invention may be produced using the cut sheet-like material 34 and preferably using roll-to-roll (Roll to Roll). In the following description, roll-to-roll is also referred to as "RtoR".

As is well known, RtoR is a production method of pulling out a long raw material from a roll around which the raw material is pulled out, performing various treatments such as film formation and a surface treatment while transporting the raw material in the longitudinal direction, and winding the treated raw material into a roll shape again.

In a case where the piezoelectric film 10 is produced using the above-described production method by RtoR, a first roll obtained by winding the long sheet-like material 34 including the lower electrode 16 or the like and a second roll obtained by winding the long sheet-like material 38 including the upper electrode 14 or the like are used.

The first roll and the second roll may be exactly the same as each other.

The lower laminate 36L in which the sheet-like material 34 and the lower piezoelectric layer 12L are laminated is prepared by pulling out the sheet-like material 34 from the first roll, coating the lower electrode 16 of the sheet-like material 34 with the coating material containing the polymer material and the piezoelectric particles 26 while the laminate is transported in the longitudinal direction, and drying the coating material by performing heating or the like to form the lower piezoelectric layer 12L of the piezoelectric layer 12 on the lower electrode 16.

Next, the lower piezoelectric layer 12L is subjected to the polarization treatment. Here, in a case where the piezoelectric film 10 is produced by RtoR, the polarization treatment is performed on the lower piezoelectric layer 12L by a rod-like electrode disposed in a state of extending in a direction orthogonal to the transport direction of the lower laminate 36L while the lower laminate 36L is transported.

Meanwhile, the sheet-like material 38 is pulled out from the second roll formed by winding the long sheet-like material 38, the upper piezoelectric layer 12U of the piezoelectric layer 12 is formed to prepare the upper laminate 36U in the same manner as that for the lower piezoelectric layer 12L while the sheet-like material 38 is transported, and the polarization treatment is performed on the upper piezoelectric layer 12U of the upper laminate 36U.

In this case, the ratio between the amount of the polymer material which is the polymer matrix 24 and the amount of the piezoelectric particles 26 is changed in the coating material for forming the upper piezoelectric layer 12U with respect to the coating material for forming the lower piezoelectric layer 12L as described above in order to set to the area ratio of the piezoelectric particles 26 in the first region 12a to be different from the area ratio of the piezoelectric particles 26 in the tenth region 12b. Further, as described above, the polarization direction in the polarization treatment is set to the direction opposite to that of the lower piezoelectric layer 12L.

Thereafter, the lower laminate 36L and the upper laminate 36U that have been subjected to the polarization treatment are transported in the longitudinal direction in a state where the lower piezoelectric layer 12L and the upper piezoelectric layer 12U face each other, and both are laminated. Further, the laminate of the lower laminate 36L and the upper laminate 36U is subjected to thermal compression bonding by being sandwiched and transported by a pair of heating rollers to complete the piezoelectric film 10 according to the embodiment of the present invention, and the piezoelectric film 10 is wound in a roll shape.

In the above-described example, the piezoelectric film 10 according to the embodiment of the present invention is prepared by transporting the sheet-like material (laminate) only once in the longitudinal direction by RtoR, but the present invention is not limited thereto. That is, in a case where any one or more steps are completed, a long sheet-like material may be wound in a roll shape, and the next step may be performed by pulling out the sheet-like material from the roll.

For example, the lower laminate 36L that has been subjected to the polarization treatment of the tenth region 12b is once wound in a roll shape. Further, the upper laminate 36U that has been subjected to the polarization treatment of the first region 12a is also once wound in a roll shape. Thereafter, the lower laminate 36L is pulled out from one roll, the upper laminate 36U is pulled out from the other roll, and the lower piezoelectric layer 12L and the upper piezoelectric layer 12U are laminated and subjected to thermal compression bonding while the lower piezoelectric layer 12L and the upper piezoelectric layer 12U face each other and are transported in the longitudinal direction, and thus the piezoelectric film 10 according to the embodiment of the present invention is completed and may be wound in a roll shape.

Figure 6:
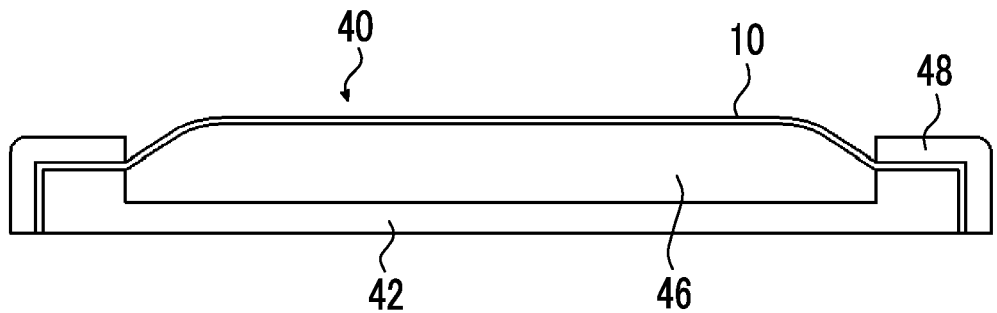
FIG. 6 conceptually illustrates an example of a piezoelectric speaker formed of the piezoelectric film illustrated in FIG. 1.

FIG. 6 is a conceptual view illustrating an example of a flat plate type piezoelectric speaker formed of the piezoelectric film 10 according to the embodiment of the present invention.

The piezoelectric speaker 40 is a flat plate type piezoelectric speaker that uses the piezoelectric film 10 according to the embodiment of the present invention as a vibration plate that converts an electrical signal into vibration energy. Further, the piezoelectric speaker 40 can also be used as a microphone, a sensor, or the like.

The piezoelectric speaker 40 is configured to have the piezoelectric film 10, a case 42, a viscoelastic support 46, and a frame 48.

The case 42 is a thin housing formed of plastic or the like and having one surface that is open. Examples of the shape of the housing include a rectangular parallelepiped shape, a cubic shape, and a cylindrical shape.

Further, the frame 48 is a frame material that has, in the center thereof, a through hole having the same shape as the open surface of the case 42 and engages with the open surface side of the case 42.

The viscoelastic support 46 is a support used for efficiently converting the stretch and contraction movement of the piezoelectric film 10 into a forward and rearward movement by means of having appropriate viscosity and elasticity, supporting the piezoelectric film 10, and applying a constant mechanical bias to any place of the piezoelectric film. Examples of the viscoelastic support 46 include wool felt, nonwoven fabric such as wool felt containing PET, and glass wool. As described above, the forward and rearward movement of the piezoelectric film 10 denotes a movement of the piezoelectric film 10 in a direction (direction perpendicular to) orthogonal to the surface of the film of the piezoelectric film 10.

The piezoelectric speaker 40 is configured by accommodating the viscoelastic support 46 in the case 42, covering the case 42 and the viscoelastic support 46 with the piezoelectric film 10, and fixing the frame 48 to the case 42 in a state of pressing the periphery of the piezoelectric film 10 against the upper end surface of the case 42 by the frame 48.

Here, in the piezoelectric speaker 40, the viscoelastic support 46 has a shape in which the height (thickness) is larger than the height of the inner surface of the case 42.

Therefore, in the piezoelectric speaker 40, the viscoelastic support 46 is held in a state of being thinned by being pressed downward by the piezoelectric film 10 at the peripheral portion of the viscoelastic support 46. Similarly, in the peripheral portion of the viscoelastic support 46, the curvature of the piezoelectric film 10 suddenly fluctuates, and a rising portion that decreases in height toward the periphery of the viscoelastic support 46 is formed in the piezoelectric film 10. Further, the central region of the piezoelectric film 10 is pressed by the viscoelastic support 46 having a square columnar shape and has a (approximately) planar shape.

In the piezoelectric speaker 40, in a case where the piezoelectric film 10 is stretched in the plane direction due to the application of a driving voltage to the lower electrode 16 and the upper electrode 14, the rising portion of the piezoelectric film 10 changes the angle in a rising direction due to the action of the viscoelastic support 46 in order to absorb the stretched part. As a result, the piezoelectric film 10 having the planar portion moves upward.

On the contrary, in a case where the piezoelectric film 10 contracts in the plane direction due to the application of the driving voltage to the lower electrode 16 and the upper electrode 14, the rising portion of the piezoelectric film 10 changes the angle in a falling direction (a direction approaching the flat surface) in order to absorb the contracted part. As a result, the piezoelectric film 10 having the planar portion moves downward.

The piezoelectric speaker 40 generates a sound by the vibration of the piezoelectric film 10.

In the piezoelectric film 10 according to the embodiment of the present invention, the conversion from the stretching and contracting movement to vibration can also be achieved by holding the piezoelectric film 10 in a curved state.

Therefore, the piezoelectric film 10 according to the embodiment of the present invention can function as a piezoelectric speaker having flexibility by being simply maintained in a curved state instead of the flat plate-like piezoelectric speaker 40 having rigidity as illustrated in FIG. 6.

The piezoelectric speaker formed of the piezoelectric film 10 according to the embodiment of the present invention can be stored in a bag or the like by, for example, being rolled or folded using the excellent flexibility. Therefore, with the piezoelectric film 10 according to the embodiment of the present invention, a piezoelectric speaker that can be easily carried even in a case where the piezoelectric speaker has a certain size can be realized.

Further, as described above, the piezoelectric film 10 according to the embodiment of the present invention has excellent elasticity and excellent flexibility, and has no in-plane anisotropy as a piezoelectric characteristic. Therefore, in the piezoelectric film 10 according to the embodiment of the present invention, a change in acoustic quality regardless of the direction in which the film is bent is small, and a change in acoustic quality with respect to the change in curvature is also small. Accordingly, the piezoelectric speaker formed of the piezoelectric film 10 according to the embodiment of the present invention has a high degree of freedom of the installation place and can be attached to various products as described above. For example, a so-called wearable speaker can be realized by attaching the piezoelectric film 10 according to the embodiment of the present invention to clothing such as a suit and portable items such as a bag in a curved state.

Further, as described above, the piezoelectric film according to the embodiment of the present invention can be used for a speaker of a display device by bonding the piezoelectric film to a display device having flexibility such as an organic EL display device having flexibility or a liquid crystal display device having flexibility.

As described above, the piezoelectric film 10 according to the embodiment of the present invention stretches and contracts in the plane direction in a case where a voltage is applied, and vibrates suitably in the thickness direction due to the stretch and contraction in the plane direction, and thus a satisfactory acoustic characteristic of outputting a sound with a high sound pressure is exhibited in a case where the piezoelectric film 10 is used for a piezoelectric speaker or the like.

The piezoelectric film 10 according to the embodiment of the present invention, which exhibits satisfactory acoustic characteristics, that is, high stretch and contraction performance due to piezoelectricity is satisfactorily operated as a piezoelectric vibrating element that vibrates a vibration body such as a vibration plate by laminating a plurality of the piezoelectric films. Since the piezoelectric film 10 according to the embodiment of the present invention has high durability, high durability is also exhibited in a case where the piezoelectric films are laminated to form a piezoelectric vibrating element.

Further, in a case of lamination of the piezoelectric films 10, each piezoelectric film may not have the upper protective layer 18 and/or the lower protective layer 20 unless there is a possibility of a short circuit. Alternatively, the piezoelectric film that does not have the upper protective layer 18 and/or the lower protective layer 20 may be laminated through an insulating layer.

As an example, a speaker in which a laminate of the piezoelectric films 10 is bonded to the vibration plate and the vibration plate is vibrated by the laminate of the piezoelectric films 10 to output a sound may be used. That is, in this case, the laminate of the piezoelectric film 10 acts as a so-called exciter that outputs a sound by vibrating the vibration plate.

By applying a driving voltage to the laminated piezoelectric films 10, each piezoelectric film 10 stretches and contracts in the plane direction, and the entire laminate of the piezoelectric film 10 stretches and contracts in the plane direction due to the stretch and contraction of each piezoelectric film 10. The vibration plate to which the laminate has been attached is bent due to the stretch and contraction of the laminate of the piezoelectric film 10 in the plane direction, and thus the vibration plate vibrates in the thickness direction. The vibration plate generates a sound using the vibration in the thickness direction. The vibration plate vibrates according to the magnitude of the driving voltage applied to the piezoelectric film 10 and generates a sound according to the driving voltage applied to the piezoelectric film 10.

Therefore, the piezoelectric film 10 itself does not output sound in this case.

Therefore, even in a case where the rigidity of each piezoelectric film 10 is low and the stretching and contracting force thereof is small, the rigidity is increased by laminating the piezoelectric films 10, and the stretching and contracting force as the entire laminate is increased. As a result, in the laminate of the piezoelectric films 10, even in a case where the vibration plate has a certain degree of rigidity, the vibration plate is sufficiently bent with a large force and the vibration plate can be sufficiently vibrated in the thickness direction, whereby the vibration plate can generate a sound.

In the laminate of the piezoelectric film 10, the number of laminated piezoelectric films 10 is not limited, and the number of sheets set such that a sufficient amount of vibration is obtained may be appropriately set according to, for example, the rigidity of the vibration plate to be vibrated.

Further, one piezoelectric film 10 according to an embodiment of the present invention can also be used as a similar exciter (piezoelectric vibrating element) in a case where the piezoelectric film has a sufficient stretching and contracting force.

The vibration plate vibrated by the laminate of the piezoelectric film 10 according to the embodiment of the present invention is not limited, and various sheet-like materials (such as plate-like materials and films) can be used.

Examples thereof include a resin film consisting of polyethylene terephthalate (PET) and the like, foamed plastic consisting of foamed polystyrene and the like, a paper material such as a corrugated cardboard material, a glass plate, and wood. Further, a device such as a display device may be used as the vibration plate in a case where the device can be sufficiently bent.

It is preferable that the laminate of the piezoelectric film 10 according to the embodiment of the present invention is obtained by bonding adjacent piezoelectric films with a bonding layer (bonding agent). Further, it is preferable that the laminate of the piezoelectric film 10 and the vibration plate are also bonded to each other with a bonding layer.

The bonding layer is not limited, and various layers that can bond materials to be bonded can be used. Therefore, the bonding layer may consist of a pressure sensitive adhesive or an adhesive. It is preferable that an adhesive layer consisting of an adhesive is used from the viewpoint that a solid and hard bonding layer is obtained after the bonding.

The same applies to the laminate formed by folding back the long piezoelectric film 10 described later.

In the laminate of the piezoelectric films 10, the polarization direction of each piezoelectric film 10 to be laminated is not limited. As described above, the polarization direction of the piezoelectric film 10 according to the embodiment of the present invention is the polarization direction in the thickness direction.

Therefore, in the laminate of the piezoelectric films 10, the polarization directions may be the same for all the piezoelectric films 10, and piezoelectric films having different polarization directions may be present.

Here, in the laminate of the piezoelectric films 10, it is preferable that the piezoelectric films 10 are laminated such that the polarization directions of the adjacent piezoelectric films 10 are opposite to each other.

In the piezoelectric film 10, the polarity of the voltage to be applied to the piezoelectric layer 12 depends on the polarization direction. Therefore, even in a case where the polarization direction is directed from the upper electrode 14 toward the lower electrode 16 or from the lower electrode 16 toward the upper electrode 14, the polarity of the upper electrode 14 and the polarity of the lower electrode 16 in all the piezoelectric films 10 to be laminated are set to be the same polarity.

Therefore, by reversing the polarization directions of the adjacent piezoelectric films 10, even in a case where the thin film electrodes of the adjacent piezoelectric films 10 come into contact with each other, the thin film electrodes in contact with each other have the same polarity, and thus there is no risk of a short circuit.

The laminate of the piezoelectric film 10 may be configured such that a long piezoelectric film 10 is folded back, for example, once or more times, or preferably a plurality of times to laminate a plurality of layers of the piezoelectric films 10.

The configuration in which the long piezoelectric film 10 is folded back and laminated has the following advantages.

That is, in the laminate in which a plurality of cut sheet-like piezoelectric films 10 are laminated, the upper electrode 14 and the lower electrode 16 need to be connected to a driving power source for each piezoelectric film. On the contrary, in the configuration in which the long piezoelectric film 10 is folded back and laminated, only one sheet of the long piezoelectric film 10 can form the laminate. Further, in the configuration in which the long piezoelectric film 10 is folded back and laminated, only one power source is required for applying the driving voltage, and the electrode may be pulled out from the piezoelectric film 10 at one place.

Further, in the configuration in which the long piezoelectric film 10 is folded back and laminated, the polarization directions of the adjacent piezoelectric films 10 are inevitably opposite to each other.

Hereinbefore, the piezoelectric film according to the embodiment of the present invention have been described in detail, but the present invention is not limited to the above-described examples, and various improvements or modifications may be made within a range not departing from the scope of the present invention.

EXAMPLES

Hereinafter, the present invention will be described in more detail with reference to specific examples of the present invention. Further, the present invention is not limited to the examples, and the materials, the used amounts, the proportions, the treatment contents, the treatment procedures, and the like shown in the following examples can be appropriately changed within a range not departing from the scope of the present invention.

Example 1

A piezoelectric film was prepared by the method illustrated in FIGS. 2 to 4.

First, cyanoethylated PVA (CR-V, manufactured by Shin-Etsu Chemical Co., Ltd.) was dissolved in dimethylformamide (DMF) at the following compositional ratio. Thereafter, PZT particles serving as the piezoelectric particles were added to the solution at the following compositional ratio, and the solution was stirred using a propeller mixer (rotation speed of 2000 rpm), thereby preparing each coating material (a coating material A and a coating material B) for forming a piezoelectric layer.

Coating Material A
  PZT Particles: 300 parts by mass
  Cyanoethylated PVA: 30 parts by mass
  DMF: 70 parts by mass
Coating Material B
  PZT particles: 10 parts by mass
  Cyanoethylated PVA: 30 parts by mass
  DMF: 70 parts by mass Further, PZT particles obtained by sintering mixed powder, formed by wet-mixing powder of a Pb oxide, a Zr oxide, and a Ti oxide as the main components such that the amount of Zr and the amount of Ti respectively reached 0.52 moles and 0.48 moles with respect to 1 mole of Pb using a ball mill, at 800° C. for 5 hours and being subjected to a crushing treatment were used as the PZT particles.

Further, a sheet-like material obtained by performing vacuum vapor deposition on a copper thin film having a thickness of 0.1 µm was prepared on a PET film having a thickness of 4 µm. That is, in the present example, the upper electrode and the lower electrode are copper-deposited thin films having a thickness of 0.1 m, and the upper protective layer and the lower protective layer are PET films having a thickness of 4 µm.

The lower electrode (copper-deposited thin film) of the sheet-like material having the lower electrode and the lower protective layer was coated with the coating material A for forming the piezoelectric layer prepared in advance using a slide coater.

Next, the material obtained by coating the sheet-like material was heated and dried on a hot plate at 120° C. to evaporate DMF, and the coating material was dried and cured. In this manner, a lower laminate in which the lower thin film electrode made of copper was provided on the lower protective layer made of PET and the lower piezoelectric layer of the piezoelectric layer was formed thereon was prepared.

Next, the lower piezoelectric layer was subjected to a polarization treatment in the thickness direction.

In this manner, a lower laminate in which the lower protective layer, the lower electrode, and the lower piezoelectric layer were laminated and which was subjected to the polarization treatment of the lower piezoelectric layer was formed.

Further, an upper piezoelectric layer of the piezoelectric layer was formed on the upper electrode (copper-deposited thin film) of the sheet-like material having the upper electrode and the upper protective layer and the polarization treatment was performed in the same manner as described above except that the coating material B was used. In this manner, an upper laminate was formed by laminating the upper protective layer, the upper electrode, and the upper piezoelectric layer of the piezoelectric layer and by being subjected to the polarization treatment of the upper piezoelectric layer.

The lower laminate and the upper laminate on which the polarization treatment of the piezoelectric layer had been performed were laminated such that the lower piezoelectric layer and the upper piezoelectric layer faced each other.

The piezoelectric film as illustrated in FIG. 1 was prepared by performing thermal compression bonding on the laminate of the lower piezoelectric layer and the upper piezoelectric layer at a temperature of 120° C. and a pressing force of 0.01 MPa using a laminator device, and bonding and adhering the tenth region and the first region to each other.

The thickness of the piezoelectric layer of the prepared piezoelectric film was 96 µm.

A sample was cut out from the prepared piezoelectric film, and the area ratios of the piezoelectric particles in the first region and the tenth region of the piezoelectric film were measured by the following method.

First, the piezoelectric film was cut in the thickness direction in order to observe the cross section of the piezoelectric film. The piezoelectric film was cut by mounting a histo knife blade (manufactured by Drukker) having a width of 8 mm on RM2265 (manufactured by Leica Biosystems) and setting the speed to a controller scale of 1 and an engagement amount of 0.25 µm to 1 µm.

The cross section thereof was observed with a SEM (for example, SU8220, manufactured by Hitachi High-Tech Corporation).

The sample was subjected to a conductive treatment by Pt vapor deposition, and the work distance was set to 8 mm.

The observation was made under conditions of a secondary-electron (SE) image (Upper) and an acceleration voltage of 1.0 kV, the sharpest image was output by focus adjustment and astigmatism adjustment, and automatic brightness adjustment (auto setting, brightness: 0, contrast: 0) was carried out in a state where the piezoelectric film covered the entire screen.

The imaging magnification was set as the magnification in which the upper electrode and the lower electrode fit on one screen and the width between the electrodes was at least half of the screen. Here, an image was captured such that two electrodes were horizontal to the lower portion of the image.

The image binarization was carried out by setting the lower limit of the threshold to the minimum value at which the protective layer was not colored, and the upper limit of the threshold to 255 which was the maximum set value, using image analysis software ImageJ.

The colored portion between the upper electrode and the lower electrode was divided into ten equal regions in the thickness direction.

The area ratio of the PZT particles in the area of the piezoelectric film was calculated with the total area of the PZT particles as a numerator and the area of the piezoelectric film as a denominator in the region on the uppermost electrode side among the equally divided ten regions. In this manner, the area ratio of the PZT particles (piezoelectric particles) in the first region adjacent to the upper electrode was calculated. Further, the area of the piezoelectric film was calculated with the width in the vertical direction (thickness direction) as 1/10 between the electrodes and the width in the horizontal direction as both ends of the SEM image.

Further, the area ratio of the PZT particles in the area of the piezoelectric film was calculated with the total area of the PZT particles as a numerator and the area of the piezoelectric film as a denominator in the region on the lowermost electrode side among the equally divided ten regions. In this manner, the area ratio of the PZT particles (piezoelectric particles) in the tenth region adjacent to the lower electrode was calculated. Further, the area of the piezoelectric film was calculated with the width in the vertical direction (thickness direction) as 1/10 between the electrodes and the width in the horizontal direction as both ends of the SEM image in the same manner as described above.

The area ratios of the PZT particles in the first region and the tenth region were calculated with optional ten cross sections of the prepared piezoelectric film. The average value of the area ratios of the PZT particles in the first region and the area ratios of the PZT particles in the tenth region in the ten cross sections was calculated. This average value was set as the area ratio of PZT particles in the first region and the area ratio of PZT particles in the tenth region of the piezoelectric layer of the prepared piezoelectric film.

As a result, the area ratio of the PZT particles in the first region was 2.8%, and the area ratio of the PZT particles in the tenth region was 75.9%.

In the present example, the area ratio of the PZT particles in the first region (upper electrode side) was lower than that in the tenth region.

Therefore, the ratio of the area ratio of the PZT particles was calculated by dividing the area ratio of the PZT particles in the tenth region with a higher area ratio of the PZT particles by the area ratio of the PZT particles in the first region with a lower area ratio of the PZT particles. As a result, the ratio of the area ratio of the PZT particles was 27.5. That is, the area of the PZT particles in the tenth region with a higher area ratio was 27.5 in a case where that the area of the PZT particles in the first region with a lower area ratio was set as 1.

Further, the average area ratio of the PZT particles was 39.3%.

Examples 2 to 8, Examples 10 to 15, Examples 17 to 19, and Comparative Examples 1 to 5

Each piezoelectric film was prepared by forming the upper laminate and the lower laminate in the same manner as in Example 1 except that the coating thickness of the coating material forming the piezoelectric layer and the ratio between the amount of PZT particles and the amount of cyanoethylated PVA in the coating material A and the coating material B were respectively changed in the formation of the upper laminate and the lower laminate.

The ratio of the area ratio and the average area ratio of the PZT particles were calculated by measuring the area ratio of the PZT particles in the first region and the area ratio of the PZT particles in the tenth region in the prepared piezoelectric film in the same manner as in Example 1.

Example 9

A laminate including the lower protective layer, the lower electrode, and the piezoelectric layer on which the calender treatment and the polarization treatment were performed was prepared in the same manner as that for the formation of the lower laminate in Example 1 except that the ratio between the amount of PZT particles and the amount of cyanoethylated PVA in the coating material A and the coating thickness of the coating material A forming the piezoelectric layer were changed. The ratio of the amount of PZT particles to the amount of cyanoethylated PVA (PZT particles:cyanoethylated PVA) in the coating material A was set to 185:30 (parts by mass).

However, the coating material A was dried by allowing the coating material A to stand at room temperature without using a hot plate at 120° C. That is, in the present example, the time of drying the coating material forming the piezoelectric layer was set to be significantly longer than usual.

Figure 5:
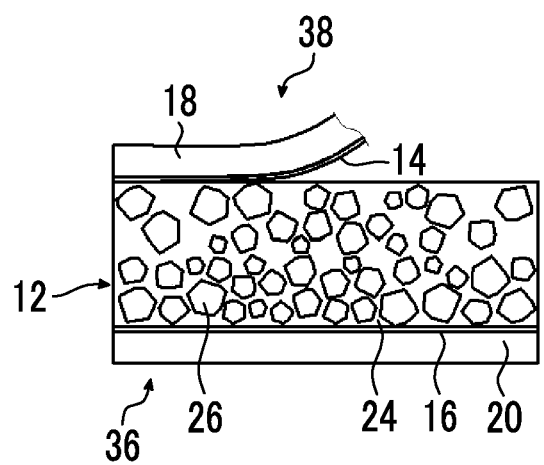
FIG. 5 is a conceptual view for describing another example of the method of producing the piezoelectric film illustrated in FIG. 1.

The sheet-like material including the same upper electrode and the same upper protective layer as in Example 1 was laminated on the prepared laminate such that the upper electrode and the piezoelectric layer faced to each other (see FIG. 5).

The ratio of the area ratio and the average area ratio of the PZT particles were calculated by measuring the area ratio of the PZT particles in the first region and the area ratio of the PZT particles in the tenth region in the prepared piezoelectric film in the same manner as in Example 1.

Example 16

A laminate including the lower protective layer, the lower electrode, and the piezoelectric layer on which the calender treatment and the polarization treatment were performed was prepared in the same manner as that for the formation of the lower laminate in Example 1 except that the amount of DMF in the coating material was changed to 210 parts by mass and the coating thickness of the coating material A forming the piezoelectric layer was changed.

The sheet-like material including the same upper electrode and the same upper protective layer as in Example 1 was laminated on the prepared laminate such that the upper electrode and the piezoelectric layer faced to each other (see FIG. 5).

The ratio of the area ratio and the average area ratio of the PZT particles were calculated by measuring the area ratio of the PZT particles in the first region and the area ratio of the PZT particles in the tenth region in the prepared piezoelectric film in the same manner as in Example 1.

Example 20

A piezoelectric film was prepared in the same manner as in Example 1 except that the ratio of the coating thickness of the coating material A to the coating thickness of the coating material B was set to 9:1 (coating thickness of the coating material A was 9).

The ratio of the area ratio and the average area ratio of the PZT particles were calculated by measuring the area ratio of the PZT particles in the first region and the area ratio of the PZT particles in the tenth region in the prepared piezoelectric film in the same manner as in Example 1.

Preparation of Piezoelectric Speaker and Measurement of Sound Pressure

The piezoelectric speaker illustrated in FIG. 6 was prepared using the prepared piezoelectric film.

First, a rectangular test piece having a size of 210×300 mm (A4 size) was cut out from the prepared piezoelectric film. The cut-out piezoelectric film was placed on a 210×300 mm case in which glass wool serving as a viscoelastic support was stored in advance as illustrated in FIG. 6, and the peripheral portion was pressed by a frame to impart an appropriate tension and an appropriate curvature to the piezoelectric film, thereby preparing a piezoelectric speaker as illustrated in FIG. 6.

The depth of the case was set to 9 mm, the density of glass wool was set to 32 kg/m³, and the thickness before assembly was set to 25 mm. Further, all the piezoelectric speakers were prepared by setting the lower electrode side of the piezoelectric film as the viscoelastic support side.

Figure 7:
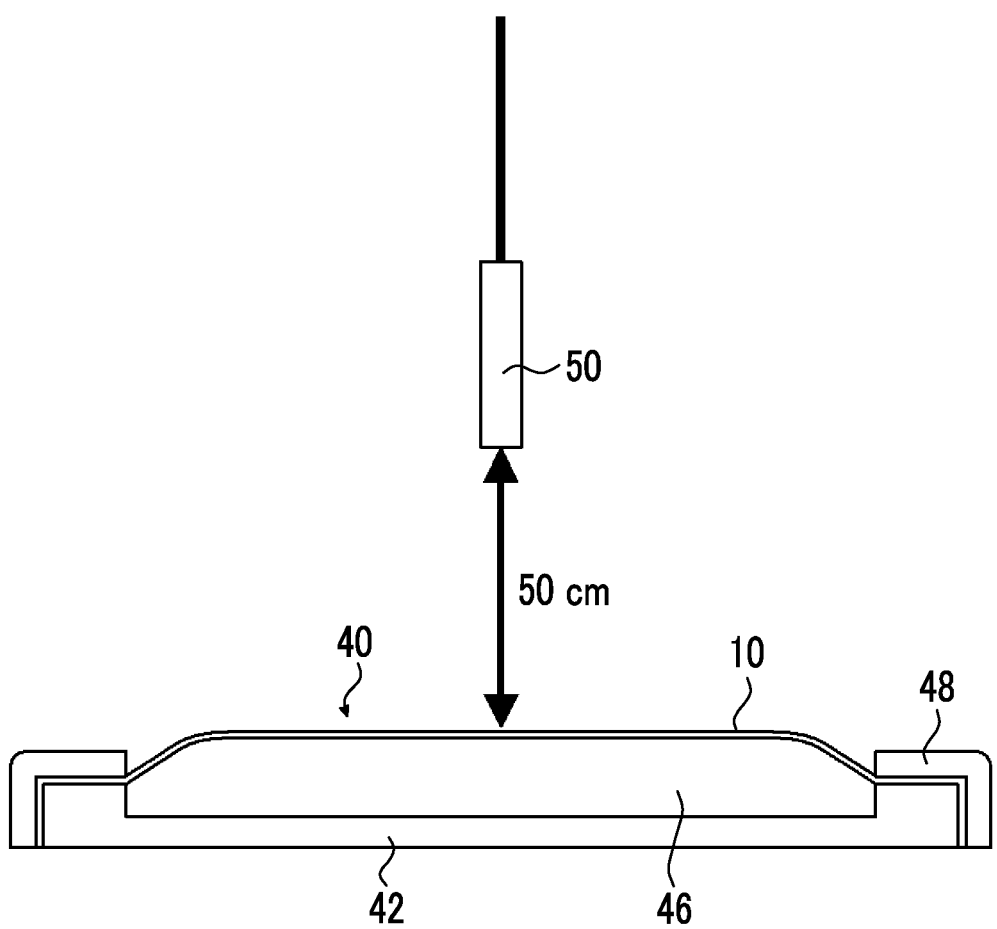
FIG. 7 is a conceptual view for describing a method of measuring a sound pressure in an example.

A 1 kHz sine wave was input to the prepared piezoelectric speaker as an input signal through a power amplifier, and the sound pressure was measured with a microphone 50 placed at a distance of 50 cm from the center of the speaker as illustrated in FIG. 7.

The sound pressure was measured twice, 30 seconds after the start of the output from the piezoelectric speaker (initial) and 36 hours after the start of the output from the piezoelectric speaker (after the durability test). The initial sound pressure (initial), the sound pressure after the durability test (after the durability test), and the difference (deterioration) between the initial sound pressure and the sound pressure after the durability test are listed in Table 1.

TABLE 1

| | Piezoelectric layer | | | | | Sound pressure [dB] | | |
|---|---|---|---|---|---|---|---|---|
| | Film thickness [μm] | Area ratio of PZT [%] | | Ratio of area ratio | Average area ratio [%] | Preparation method | Initial sound pressure | After durability test | Deterioration |
| | | First region | Tenth region | | | | | | |
| Example 1 | 98 | 2.8 | 75.9 | 27.1 | 39.4 | Bonding two layers at thickness ratio of 1:1 | 69.8 | 67.5 | −2.3 |
| Example 2 | 34 | 1.6 | 76.4 | 47.0 | 39.0 | Bonding two layers at thickness ratio of 1:1 | 70.2 | 67.8 | −2.4 |
| Example 3 | 95 | 70.0 | 10.1 | 6.9 | 40.1 | Bonding two layers at thickness ratio of 1:1 | 70.2 | 65.9 | −4.3 |
| Example 4 | 71 | 10.2 | 80.5 | 7.9 | 45.3 | Bonding two layers at thickness ratio of 1:1 | 70.4 | 66.8 | −3.6 |
| Example 5 | 50 | 7.4 | 76.1 | 10.3 | 41.7 | Bonding two layers at thickness ratio of 1:1 | 70.0 | 66.1 | −3.9 |
| Example 6 | 50 | 76.1 | 7.4 | 10.3 | 41.7 | Bonding two layers at thickness ratio of 1:1 | 70.0 | 66.1 | −3.9 |
| Example 7 | 50 | 24.2 | 20.0 | 1.2 | 22.1 | Bonding two layers at thickness ratio of 1:1 | 56.3 | 42.1 | −14.2 |
| Example 8 | 32 | 7.3 | 69.0 | 9.5 | 38.1 | Bonding two layers at thickness ratio of 1:1 | 70.0 | 67.5 | −2.5 |
| Example 9 | 11 | 7.4 | 86.5 | 11.6 | 47.0 | Drying performed for long time with one layer | 69.6 | 67.8 | −1.8 |
| Example 10 | 98 | 84.8 | 16.1 | 5.3 | 50.5 | Bonding two layers at thickness ratio of 1:1 | 73.0 | 63.6 | −9.4 |
| Example 11 | 72 | 15.6 | 76.4 | 4.9 | 46.0 | Bonding two layers at thickness ratio of 1:1 | 71.6 | 64.0 | −7.6 |
| Example 12 | 49 | 24.8 | 76.1 | 3.1 | 50.4 | Bonding two layers at thickness ratio of 1:1 | 69.6 | 64.4 | −5.2 |
| Example 13 | 50 | 69.1 | 15.0 | 4.6 | 42.0 | Bonding two layers at thickness ratio of 1:1 | 71.0 | 65.5 | −5.5 |
| Example 14 | 50 | 16.0 | 32.1 | 2.0 | 24.1 | Bonding two layers at thickness ratio of 1:1 | 62.0 | 51.7 | −10.3 |
| Example 15 | 31 | 26.0 | 62.1 | 2.4 | 44.1 | Bonding two layers at thickness ratio of 1:1 | 65.4 | 55.3 | −10.1 |
| Example 16 | 12 | 13.7 | 62.8 | 4.6 | 38.2 | Coating material having low concentration with one layer | 69.8 | 65.7 | −4.1 |
| Example 17 | 94 | 55.3 | 83.5 | 1.5 | 69.4 | Bonding two layers at thickness ratio of 1:1 | 79.6 | 62.7 | −16.9 |
| Example 18 | 52 | 12.1 | 28.2 | 2.3 | 20.2 | Bonding two layers at thickness ratio of 1:1 | 52.0 | 38.4 | −13.6 |
| Example 19 | 30 | 61.7 | 76.4 | 1.2 | 69.0 | Bonding two layers at thickness ratio of 1:1 | 79.0 | 59.5 | −19.5 |
| Example 20 | 9 | 59.8 | 80.0 | 1.3 | 69.9 | Bonding two layers at thickness ratio of 1:1 | 80.0 | 65.5 | −14.5 |
| Comparative Example 1 | 94 | 66.7 | 76.4 | 1.1 | 71.6 | Bonding two layers at thickness ratio of 1:1 | 87.0 | 62.3 | −24.7 |
| Comparative Example 2 | 52 | 71.2 | 73.8 | 1.0 | 72.5 | Bonding two layers at thickness ratio of 1:1 | 84.0 | 54.3 | −29.7 |
| Comparative Example 3 | 53 | 0.5 | 0.5 | 1.0 | 0.5 | Bonding two layers at thickness ratio of 1:1 | 52.3 | 30.5 | −21.8 |
| Comparative Example 4 | 30 | 73.4 | 76.4 | 1.0 | 74.9 | Bonding two layers at thickness ratio of 1:1 | 85.8 | 62.4 | −23.4 |
| Comparative Example 5 | 11 | 73.6 | 75.9 | 1.0 | 74.8 | Bonding two layers at thickness ratio of 1:1 | 84.0 | 60.0 | −24.0 |

As listed in the table, in the piezoelectric film according to the embodiment of the present invention in which the piezoelectric layer was divided into ten equal regions in the thickness direction and the ratio of the area ratio obtained by dividing the area ratio of the PZT particles (piezoelectric particles) in the region with a higher area ratio by the area ratio of the PZT particles in the region with a lower area ratio in the first region adjacent to the upper electrode and the tenth region adjacent to the lower electrode was 1.2 or greater, a decrease in sound pressure after the durability test with respect to the initial sound pressure was small and the durability was excellent.

Further, as shown in Examples 5 and Example 6, the piezoelectric films according to the embodiment of the present invention were able to obtain the identical effect even in a case where the area ratio of any of the first region or the tenth region was small. Further, as listed in Table 1, the piezoelectric film according to the embodiment of the present invention can obtain the identical effect regardless of the thickness of the piezoelectric layer as long as the piezoelectric film has the identical area ratio of the PZT particles. In addition, a suitable initial sound pressure of greater than 60 dB can be obtained by setting the average area ratio of the PZT particles to 23% or greater.

On the contrary, in the comparative examples in which the ratio of the area ratio of the PZT particles was less than 1.2, the decrease in sound pressure after the durability test with respect to the initial sound pressure was large.

As shown in the results described above, the effects of the present invention are apparent.

EXPLANATION OF REFERENCES

10: piezoelectric film
12: piezoelectric layer
12a: first region
12b: tenth region
12U: upper piezoelectric layer
12L: lower piezoelectric layer
14: upper (thin film) electrode
16: lower (thin film) electrode
18: upper protective layer
20: lower protective layer
24: polymer matrix
26: piezoelectric particle
34, 38: sheet-like material
36U: upper laminate
36L: lower laminate
40: piezoelectric speaker
42: case
46: viscoelastic support
48: frame
50: microphone

What is claimed is:

1. A piezoelectric film comprising:
a polymer-based piezoelectric composite material which contains piezoelectric particles in a matrix containing a polymer material; and
electrode layers which are provided on both surfaces of the polymer-based piezoelectric composite material,
wherein in a case where a cross section of the piezoelectric film in a thickness direction is observed with a scanning electron microscope, the polymer-based piezoelectric composite material is divided into ten equal regions in the thickness direction, area ratios of the piezoelectric particles in two most distant regions are measured, and the area ratio of the piezoelectric particles in the region with a lower area ratio is set as 1, the area ratio of the piezoelectric particles in the region with a higher area ratio is 1.2 or greater.

2. The piezoelectric film according to claim 1, wherein an average area ratio of the piezoelectric particles in the two most distant regions is 23% or greater.

3. The piezoelectric film according to claim 1, wherein in the two most distant regions, in a case where the area ratio of the piezoelectric particles in the region with the lower area ratio is set as 1, the area ratio of the piezoelectric particles in the region with the higher area ratio is 70 or less.

4. The piezoelectric film according to claim 1, wherein the piezoelectric film is polarized in the thickness direction.

5. The piezoelectric film according to claim 1, wherein the piezoelectric film has no in-plane anisotropy as a piezoelectric characteristic.

6. The piezoelectric film according to claim 1, further comprising:
a lead-out wire which connects the electrode layer and an external power source.

7. The piezoelectric film according to claim 1, further comprising:
a protective layer which is laminated on a surface of at least one electrode layer.

8. The piezoelectric film according to claim 1, wherein the polymer material contains a cyanoethyl group.

9. The piezoelectric film according to claim 8, wherein the polymer material is cyanoethylated polyvinyl alcohol.

10. The piezoelectric film according to claim 1, wherein the piezoelectric particles consist of ceramic particles having a perovskite-type or wurtzite-type crystal structure.

11. The piezoelectric film according to claim 2, wherein in the two most distant regions, in a case where the area ratio of the piezoelectric particles in the region with the lower area ratio is set as 1, the area ratio of the piezoelectric particles in the region with the higher area ratio is 70 or less.

12. The piezoelectric film according to claim 2, wherein the piezoelectric film is polarized in the thickness direction.

13. The piezoelectric film according to claim 2, wherein the piezoelectric film has no in-plane anisotropy as a piezoelectric characteristic.

14. The piezoelectric film according to claim 2, further comprising:
a lead-out wire which connects the electrode layer and an external power source.

15. The piezoelectric film according to claim 2, further comprising:
a protective layer which is laminated on a surface of at least one electrode layer.

16. The piezoelectric film according to claim 2, wherein the polymer material contains a cyanoethyl group.

17. The piezoelectric film according to claim 16, wherein the polymer material is cyanoethylated polyvinyl alcohol.

18. The piezoelectric film according to claim 2, wherein the piezoelectric particles consist of ceramic particles having a perovskite-type or wurtzite-type crystal structure.

19. The piezoelectric film according to claim 3, wherein the piezoelectric film is polarized in the thickness direction.

20. The piezoelectric film according to claim 3, wherein the piezoelectric film has no in-plane anisotropy as a piezoelectric characteristic.

\* \* \* \* \*